(12) United States Patent
Weaver et al.

(10) Patent No.: US 6,861,027 B2
(45) Date of Patent: *Mar. 1, 2005

(54) METHOD AND APPARATUS FOR PROCESSING A MICROELECTRONIC WORKPIECE INCLUDING AN APPARATUS AND METHOD FOR EXECUTING A PROCESSING STEP AT AN ELEVATED TEMPERATURE

(75) Inventors: Robert A. Weaver, Whitefish, MT (US); Paul R. McHugh, Kalispell, MT (US); Gregory J. Wilson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 91 days.

This patent is subject to a terminal disclaimer.

(21) Appl. No.: 10/229,384

(22) Filed: Aug. 27, 2002

(65) Prior Publication Data

US 2003/0057614 A1 Mar. 27, 2003

Related U.S. Application Data

(63) Continuation of application No. 09/501,002, filed on Feb. 9, 2000, now Pat. No. 6,471,913.

(51) Int. Cl.[7] ................................................ C21D 1/06
(52) U.S. Cl. ........................................ 266/256; 118/725
(58) Field of Search .............................. 266/252, 256, 266/249; 219/390, 411; 118/725

(56) References Cited

U.S. PATENT DOCUMENTS

| | | | |
|---|---|---|---|
| 4,687,552 A | 8/1987 | Early et al. | |
| 4,951,601 A | 8/1990 | Maydan et al. | |
| 4,979,464 A | 12/1990 | Kunze-Concewitz et al. | |

(List continued on next page.)

FOREIGN PATENT DOCUMENTS

| | | |
|---|---|---|
| EP | 0881673 A2 | 12/1998 |
| EP | 0982771 A1 | 8/1999 |
| EP | 0964433 A2 | 12/1999 |
| EP | 1069213 A2 | 7/2000 |
| JP | 10-083960 | 3/1998 |
| WO | WO 91/04213 | 4/1991 |
| WO | WO 99/40615 | 8/1999 |
| WO | WO 99/45745 | 9/1999 |

OTHER PUBLICATIONS

U.S. Appl. No. 09/018,783, filed Feb. 4, 1998, Ritzdorf et al.
Woo Sik Yoo et al., "Rapid Thermal Furnace," Solid State Technology, Jul. 2000, pp. 223–224, 226, 228, 230.

(List continued on next page.)

Primary Examiner—Scott Kastler
(74) Attorney, Agent, or Firm—Perkins Coie LLP

(57) ABSTRACT

An apparatus for thermally processing a microelectronic workpiece is set forth. The apparatus comprises a first assembly and a second assembly, disposed opposite one another, with an actuator disposed to provide relative movement between the first assembly and second assembly. More particularly, the actuator provides relative movement between at least a loading position in which the first assembly is in a state for loading or unloading of the microelectronic workpiece, and a thermal processing position in which the first assembly and second assembly are proximate one another and form a thermal processing chamber. A thermal transfer unit is disposed in the second assembly and has a workpiece support surface that is heated and cooled in a controlled manner. As the first assembly and second assembly are driven to the thermal processing position by the actuator, an arrangement of elements bring a surface of the microelectronic workpiece into direct physical contact with the workpiece support surface of the thermal transfer unit. In a preferred embodiment, the thermal transfer unit is comprised of a low thermal mass heater and a high thermal mass cooler disposed to controllably cool the low thermal mass heater.

46 Claims, 17 Drawing Sheets

U.S. PATENT DOCUMENTS

| | | | |
|---|---|---|---|
| 5,155,336 | A | 10/1992 | Gronet et al. |
| 5,252,807 | A | 10/1993 | Chizinsky |
| 5,306,895 | A | 4/1994 | Ushikoshi et al. |
| 5,391,517 | A | 2/1995 | Gelatos et al. |
| 5,431,803 | A | 7/1995 | DiFranco et al. |
| 5,600,532 | A | 2/1997 | Michiya et al. |
| 5,650,082 | A | 7/1997 | Anderson |
| 5,651,823 | A | 7/1997 | Parodi et al. |
| 5,660,472 | A | 8/1997 | Peuse et al. |
| 5,802,856 | A | 9/1998 | Schaper et al. |
| 5,937,142 | A | 8/1999 | Moslehi et al. |
| 6,017,820 | A | 1/2000 | Ting et al. |
| 6,072,160 | A | 6/2000 | Bahl |
| 6,072,163 | A * | 6/2000 | Armstrong et al. ......... 219/497 |
| 6,086,680 | A | 7/2000 | Foster et al. |
| 6,107,192 | A | 8/2000 | Subrahmanyan et al. |
| 6,108,937 | A | 8/2000 | Raaijmakers |
| 6,130,415 | A | 10/2000 | Knoot |
| 6,136,163 | A | 10/2000 | Cheung et al. |
| 6,139,703 | A | 10/2000 | Hanson et al. |
| 6,157,106 | A | 12/2000 | Tietz et al. |
| 6,184,068 | B1 | 2/2001 | Ohtani et al. |
| 6,278,089 | B1 | 8/2001 | Young et al. |
| 6,280,183 | B1 | 8/2001 | Mayur et al. |
| 6,297,154 | B1 | 10/2001 | Gross et al. |
| 6,471,913 | B1 * | 10/2002 | Weaver et al. .............. 266/256 |

OTHER PUBLICATIONS

Satheesh Kuppurao et al., "Rapid Thermal Oxidation Technique," Solid State Technology, Jul. 2000, pp. 223–234, 236 & 239.

Osborne, Nick et al., "Hot–Wall Furnace RTP," Solid State Technology, Jul. 2000, pp. 211–212, 214, 216 & 217.

Peuse, Bruce et al., "Advances in RTP Temperature Measurement and Control," Materials Research Society Symposium—Spring 1998, pp. 1–15.

R.P.S. Thakur et al., "RTP technology for tomorrow," Jun. 1, 1998, http://www.semipark.co.kr./ifil/%EA%b8%.../ RTP%20technology%20for%20tomorrow.ht, Feb. 28, 2001.

International Search Report for International Application No. PCT/US01/04444; mailed Dec. 5, 2001; Applicant: Semitool, Inc.; 7 pages.

* cited by examiner

METHOD AND APPARATUS FOR PROCESSING A MICROELECTRONIC WORKPIECE INCLUDING AN APPARATUS AND METHOD FOR EXECUTING A PROCESSING STEP AT AN ELEVATED TEMPERATURE

CROSS-REFERENCE TO RELATED APPLICATIONS

This application is a continuation of U.S. patent application Ser. No. 09/501,002, filed Feb. 9, 2000 now U.S. Pat. No. 6,471,913.

STATEMENT REGARDING FEDERALLY SPONSORED RESEARCH OR DEVELOPMENT

Not Applicable

BACKGROUND OF THE INVENTION

The present invention is generally directed to the processing of a microelectronic workpiece. More particularly, the present invention includes a method and apparatus for processing a microelectronic workpiece at an elevated temperature.

For purposes of the present application, a microelectronic workpiece is defined to include a workpiece formed from a substrate upon which microelectronic circuits or components, data storage elements or layers, and/or micromechanical elements are formed. Although the present invention is applicable to this wide range of products, the invention will be particularly described in connection with its use in the production of interconnect structures formed during the production of integrated circuits on a semiconductor wafer. Still further, although the invention is applicable for use in connection with a wide range of metal and metal alloys as well as in connection with a wide range of elevated temperature processes, the invention will be particularly described in connection with annealing of electroplated copper and copper alloys.

In the production of semiconductor integrated circuits and other microelectronic articles from microelectronic workpieces, such as semiconductor wafers, it is often necessary to provide multiple metal layers on a substrate to serve as interconnect metallization that electrically connects the various devices on the integrated circuit to one another. Traditionally, aluminum has been used for such interconnects, however, it is now recognized that copper metallization may be preferable. Copper interconnects can help alleviate many of the problems experienced in connection with the current aluminum technology.

The microelectronic fabrication industry has sought to use copper as the interconnect metallization by using a damascene and/or patterned plating electroplating process where holes, more commonly called vias, trenches and other recesses are used to produce the desired copper patterns. In the damascene process, the wafer is first provided with a metallic seed layer and barrier/adhesion layer that are disposed over a dielectric layer into which trenches are formed. The seed layer is used to conduct electrical current during a subsequent metal electroplating step. Preferably, the seed layer is a very thin layer of metal that can be applied using one of several processes. For example, the seed layer of metal can be laid down using physical vapor deposition or chemical vapor deposition processes to produce a layer on the order of 1000 angstroms thick. The seed layer can also be formed of copper, gold, nickel, palladium, and most or all other metals. The seed layer is formed over a surface that is convoluted by the presence of the trenches, or other device features, which are recessed into the dielectric substrate.

In single damascene processes using electroplating, a process employing two electroplating operations is generally employed. First, a copper layer is electroplated onto the seed layer in the form of a blanket layer. The blanket layer is plated to an extent which forms an overlying layer, with the goal of completely providing a copper layer that fills the trenches that are used to form the horizontal interconnect wiring in the dielectric layer. The first blanket layer is then subject, for example, to a chemical mechanical polish step in which the portions of the layer extending above the trenches are removed, leaving only the trenches filled with copper. A further dielectric layer is then provided to cover the wafer surface and recessed vias are formed in the further dielectric layer. The recessed vias are disposed to overlie certain of the filled trenches. A further seed layer is applied and a further electroplated copper blanket layer are provided that extend over the surface of the further dielectric layer and fills the vias. Again, copper extending above the level of the vias is removed using, for example, chemical mechanical polishing techniques. The vias thus provide a vertical connection between the original horizontal interconnect layer and a subsequently applied horizontal interconnect layer. Electrochemical deposition of copper films has thus become an important process step in the manufacturing of high-performance microelectronic products.

Alternatively, the trenches and vias may be etched in the dielectric at the same time in what is commonly called a "dual damascene" process. These features are then processed, as above, with barrier layer, seed layer and fill/blanket layer that fill the trenches and vias disposed at the bottoms of the trenches at the same time. The excess material is then polished, as above, to produce inlaid conductors.

The mechanical properties of the copper metallization can be quite important as the metal structures are formed. This is particularly true in connection with the impact of the mechanical properties of the copper metallization during chemical mechanical polishing. Wafer-to-wafer and within wafer grain size variability in the copper film can adversely affect the polish rate of the chemical mechanical processing as well as the ultimate uniformity of the surfaces of the polished copper structures. Large grain size and low variations in grain size in the copper film are very desirable.

The electrical properties of the copper metallization are also important to the performance of the associated microelectronic device. Such devices may fail if the copper metallization exhibits excessive electromigration that ultimately results in an open or short circuit condition in one or more of the metallization structures. One factor that has a very large influence on the electromigration resistance of sub-micron metal lines is the grain size of the deposited metal. This is because grain boundary migration occurs with a much lower activation energy than trans-granular migration.

To achieve the desired electrical characteristics for the copper metallization, the grain structure of each deposited blanket layer is altered through an annealing process. This annealing process is traditionally thought to require the performance of a separate processing step at which the semiconductor wafer is subject to an elevated temperature of about 400 degrees Celsius. The relatively few annealing apparatus that are presently available are generally stand-alone batch units that are often designed for batch processing of wafers disposed in wafer boats.

The present inventors have recognized substantial improvements over the foregoing processes and apparatus currently suitable for annealing of metal microstructures. To this end, they have developed an improved annealing apparatus that may be readily integrated into a processing tool incorporating a number of other processing reactors, including, for example, an electroplating reactor.

BRIEF SUMMARY OF THE INVENTION

An apparatus for thermally processing a microelectronic workpiece is set forth. The apparatus comprises a first assembly and a second assembly, disposed opposite one another, with an actuator disposed to provide relative movement between the first assembly and second assembly. More particularly, the actuator provides relative movement between at least a loading position in which the first assembly and second assembly are in a state for loading or unloading of the microelectronic workpiece, and a thermal processing position in which the first assembly and second assembly are proximate one another and form a thermal processing chamber. A thermal transfer unit is disposed in the second assembly and has a workpiece support surface that is heated and cooled in a controlled manner. As the first assembly and second assembly are driven to the thermal processing position by the actuator, an arrangement of elements bring a surface of the microelectronic workpiece into direct physical contact with the workpiece support surface of the thermal transfer unit.

In accordance with one aspect of the present invention, the thermal transfer unit comprises a heater having a top surface forming the wafer support surface of the thermal transfer unit, and a bottom surface opposite the top surface. The thermal transfer unit also includes a cooling chuck having a surface proximate the bottom surface of the heater. Various methods and arrangements are set forth to effectively isolate the cooling chuck from the heater during a heating sub-cycle of a complete thermal processing cycle and to conduct heat from the heater to the cooling chuck during a cooling sub-cycle of the thermal processing cycle.

Another aspect of the present invention relates to the construction of the heater. In accordance with one embodiment, the heater is constructed as a thick film heater that comprises one or more ceramic substrate layers and a layer of high electrical resistance traces, with optional vacuum circuit channels formed in one or more of the layers. The traces of the layer of high electrical resistance traces may be optimized to the shape of the microelectronic workpiece, thereby transferring thermal energy to the microelectronic workpiece in an efficient and uniform manner. The vacuum circuit channels may be ported through the top substrate layer to ensure uniform contact between the workpiece and the top surface of the thick film heater. Further, the vacuum circuit channels may be ported through the lower layer to ensure uniform contact between the heater and the cooling chuck.

Another aspect of the present invention relates to the use of the thermal reactor at an annealing station of a processing tool. In accordance with one embodiment, the reactor is integrated in the processing tool along with one or more processing stations used to electrochemically deposit a metal layer, such as copper, on the surface of the microelectronic workpiece. In accordance with another embodiment, the reactor is provided in a separate module having its own robotic wafer transfer mechanism. This latter embodiment allows the annealing station to be provided to an end user as an add-on or upgrade.

DETAILED DESCRIPTION OF THE INVENTION

The present invention is described here in the context of its use in annealing copper that has been electroplated onto the surface of a microelectronic workpiece. The description in this context is made without limitation of the applicability of the invention to other processes, microelectronic products, or materials. It will be recognized, however, that the application of the disclosed thermal reactor in this context is particularly novel and non-obvious.

Figure 1A:
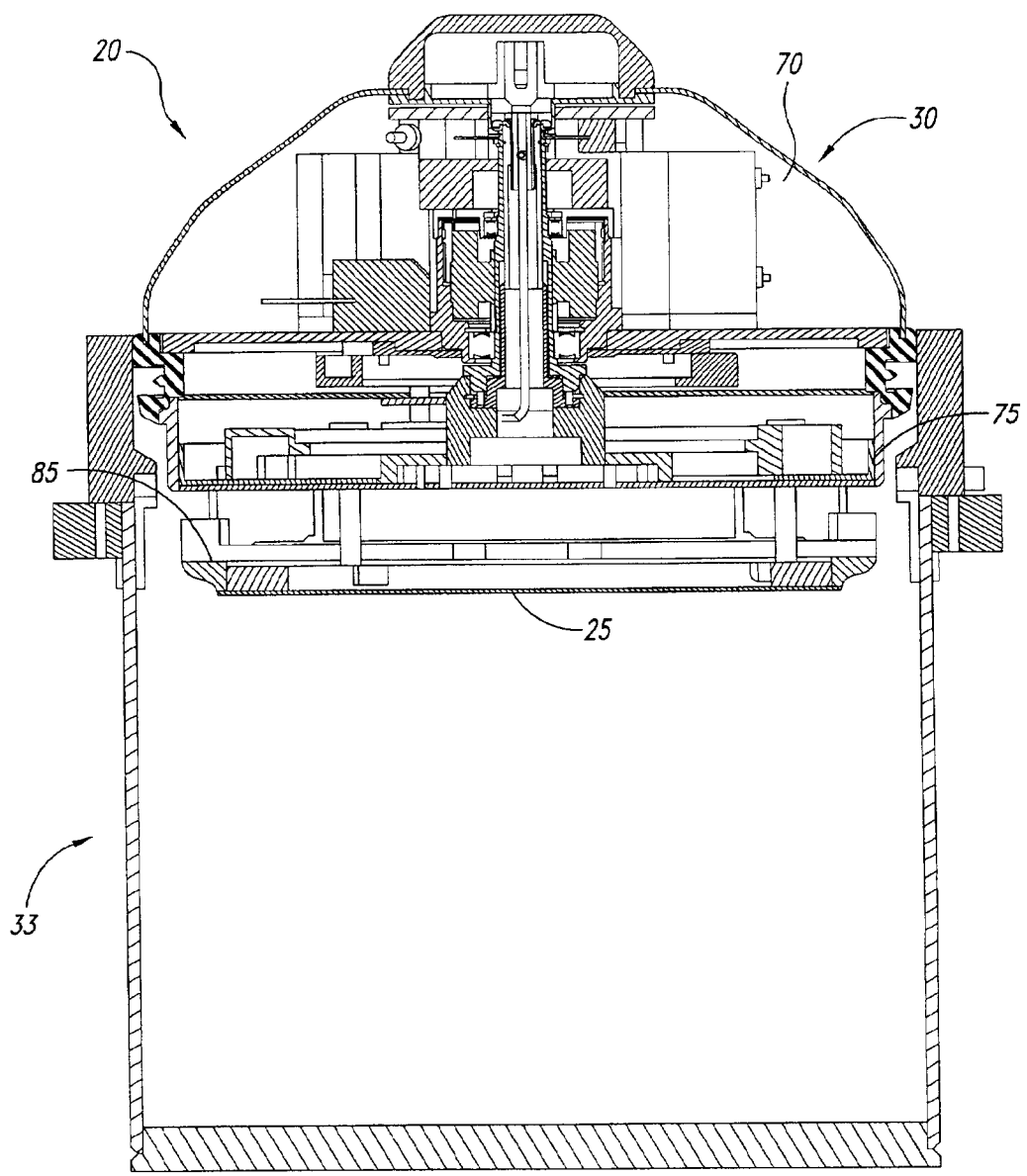
FIGS. 1A and 1B illustrate one embodiment of a plating apparatus that may be used to apply an electrochemically deposited metal layer, such as copper, to the surface of a microelectronic workpiece, such as a semiconductor wafer, the resulting metal layer being suitable for annealing in the thermal reactor of the present invention.

Before a metal layer or structure can be annealed in the thermal reactor of the present invention, the metal layer or structure must first be deposited on the surface of the microelectronic workpiece. In connection with the deposition of copper, the preferred method is electroplating. To this end, FIG. 1A shows various components of a processing station suitable for electroplating a metal, such as copper, onto a microelectronic workpiece, such as a semiconductor wafer. It will be recognized, however, that a wide variety of processing station configurations may be used to deposit the metal before it is annealed in the disclosed reactor and that the specific construction of the station is merely exemplary. For example, such a processing station may merely comprise an anode, one or more wafer contacts to render the wafer a cathode, a plating chamber having a plating bath that contacts both the wafer and the anode, and a source of plating power. Various configurations of these elements may be employed.

With reference to FIG. 1A, there is shown a reactor assembly 20 for electrochemically processing a microelectronic workpiece, such as a semiconductor wafer 25. The particular reactor shown here is configured to execute an electroplating process on the workpiece 25.

Generally stated, the reactor assembly 20 is comprised of a reactor head 30 and a corresponding reactor base, shown generally at 33 and described in detail below, in which the electroplating solution is disposed. This type of reactor assembly is particularly suited for effecting electroplating of semiconductor wafers or like workpieces, in which an electrically conductive, thin-film layer of the wafer is electroplated with a blanket or patterned metallic layer. It will be recognized, however, that the general reactor configuration of FIG. 1A is suitable for other workpiece processes as well.

The reactor head 30 of the electroplating reactor 20 is preferably comprised of a stationary assembly 70 and a rotor assembly 75. Rotor assembly 75 is configured to receive and carry an associated wafer 25 or like workpiece, position the wafer in a process-side down orientation within reactor container 35, and to rotate or spin the workpiece while joining its electrically-conductive surface in the plating circuit of the reactor assembly 20. The rotor assembly 75 includes one or more cathode contacts that provide electroplating power to the surface of the wafer. In the illustrated embodiment, a contact assembly is shown generally at 85 and is described in further detail below. It will be recognized, however, that backside contact may be implemented in lieu of front side contact when the substrate is conductive or other means are used to make electrical contact between the front and back sides of the workpiece.

The reactor head 30 is typically mounted on a lift/rotate apparatus which is configured to rotate the reactor head 30 from an upwardly-facing disposition in which it receives the wafer to be plated, to a downwardly facing disposition in which the surface of the wafer to be plated is positioned so that it may be brought into contact with the electroplating solution in reactor container 35, either planar or at a given angle. A robotic arm, which preferably includes an end effector, is typically employed for placing the wafer 25 in position on the rotor assembly 75, and for removing the plated wafer from within the rotor assembly. The contact assembly 85 may be operated between an open state that allows the wafer to be placed on the rotor assembly 75, and a closed state that secures the wafer to the rotor assembly and brings the electrically conductive components of the contact assembly 85 into electrical engagement with the surface of the wafer that is to be plated.

Processing Container

Figure 1B:
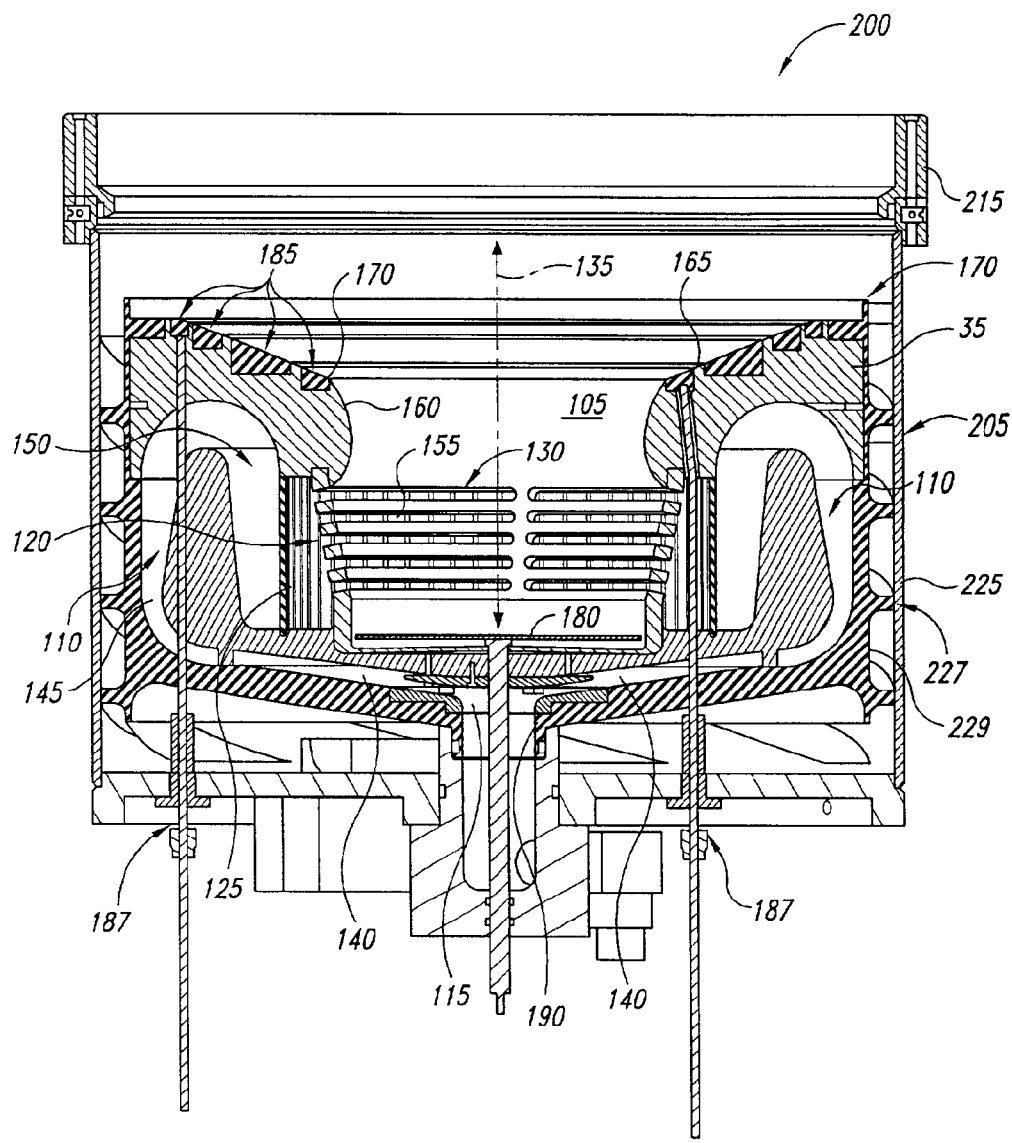

FIG. 1B illustrates the construction of one type of processing container 33. As illustrated, the processing container 33 generally comprises a main fluid flow chamber 105, an antechamber 110, a fluid inlet 115, a plenum 120, a flow guide 125 separating the plenum 120 from the antechamber 110, and a nozzle/slot assembly 130 separating the plenum 120 from the main chamber 105. These components cooperate to provide a flow (here, of the electroplating solution) at the wafer 25 with a substantially radially independent normal component. In the illustrated embodiment, the impinging flow is centered about central axis 135 and possesses a nearly uniform component normal to the surface of the wafer 25. This results in a substantially uniform mass flux to the wafer surface that, in turn, enables substantially uniform processing thereof.

Processing fluid is provided through inlet 115 disposed at the bottom of the container 35. The fluid from the inlet 115 is directed therefrom at a relatively high velocity through antechamber 110. In the illustrated embodiment, antechamber 110 includes an accelerated region 140 through which the processing fluid flows radially from the fluid inlet 115 toward fluid flow region 145 of antechamber 110. Fluid flow region 145 has a generally inverted U-shaped cross-section that is substantially wider at its outlet region proximate flow guide 125 than at its inlet region proximate region 140. This variation in the cross-section assists in removing any gas bubbles from the processing fluid before the processing fluid is allowed to enter the main chamber 105. Gas bubbles that would otherwise enter the main chamber 105 are allowed to exit the processing container 35 through a gas outlet disposed at an upper portion of the antechamber 110.

Processing fluid within antechamber 110 is ultimately supplied to main chamber 105. To this end, the processing fluid is first directed to flow from a relatively high-pressure region 150 of the antechamber 110 to the comparatively lower-pressure plenum 120 through flow guide 125. Nozzle assembly 130 includes a plurality of nozzles or slots 155 that are disposed at a slight angle with respect to horizontal. Processing fluid exits plenum 120 through nozzles 155 with fluid velocity components in the vertical and radial directions.

Main chamber 105 is defined at its upper region by a contoured sidewall 160 and a slanted sidewall 165. The contoured sidewall 160 assists in preventing fluid flow separation as the processing fluid exits nozzles 155 (particularly the uppermost nozzle(s)) and turns upward toward the surface of wafer 25. Beyond breakpoint 170, fluid flow separation will not substantially affect the uniformity of the normal flow. As such, sidewall 165 can generally have any shape, including a continuation of the shape of contoured sidewall 160. In the specific embodiment disclosed here, sidewall 165 is slanted and, as will be explained in further detail below, is used to support one or more anodes.

In those instances in which the processing base 33 forms part of an electroplating reactor, the processing base 33 is provided with one or more anodes or other electrically conductive elements. In the illustrated embodiment, a principal anode 180 is disposed in the lower portion of the main chamber 105. If the peripheral edges of the surface of the wafer 25 extend radially beyond the extent of contoured sidewall 160, then the peripheral edges are electrically shielded from principal anode 180 and reduced plating will take place in those regions. However, if plating is desired in the peripheral regions, one or more further anodes may be employed proximate the peripheral regions. Here, a plurality of annular anodes 185 are disposed in a generally concentric manner on slanted sidewall 165 to provide a flow of electroplating current to the peripheral regions. An alternative embodiment would include a single anode or multiple anodes with no shielding from the contoured walls to the edge of the wafer.

The anodes 180, 185 may be provided with electroplating power in a variety of manners. For example, the same or different levels of electroplating power may be multiplexed to the anodes 180, 185. Alternatively, all of the anodes 180, 185 may be connected to receive the same level of electroplating power from the same power source. Still further, each of the anodes 180, 185 may be connected to receive different levels of electroplating power to compensate for the variations in the resistance of the plated film. An advantage of the close proximity of the anodes 185 to the wafer 25 is that it provides a high degree of control of the radial film growth resulting from each anode. Preferably, electrical connection to the anodes 180,185 are established through connector elements 187.

Anodes 180, 185 may be consumable, but are preferably inert and formed from platinized titanium or some other inert conductive material. However, as noted above, inert anodes tend to evolve gases that can impair the uniformity of the plated film. To reduce this problem, as well as to reduce the likelihood of the entry of bubbles into the main processing chamber 105, processing container 35 includes several unique features. With respect to anode 180, a small fluid flow path 190 is provided between the underside of anode 180 and antechamber 110. This results in a Venturi effect that causes the processing fluid proximate the surfaces of anode 180 to be drawn into antechamber 110 and, further, provides a suction flow that affects the uniformity of the impinging flow at the central portion of the surface of the wafer.

As illustrated, the overall reactor assembly 200 is comprised of the processing container 35 along with a corresponding exterior cup 205. Processing container 35 is disposed within exterior cup 205 to allow exterior cup 205 to receive spent processing fluid that overflows from the processing container 35. A flange 215 extends about the assembly for securement with, for example, the frame of the corresponding tool.

Figure 2A:
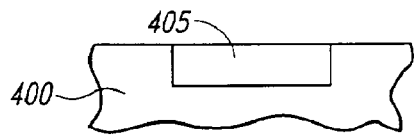
FIGS. 2A–2G illustrate the various steps used to deposit a metal in microstructures formed in the surface of a microelectronic workpiece, such metal structures being suitable for annealing in the thermal reactor of the present invention.
Figure 2B:
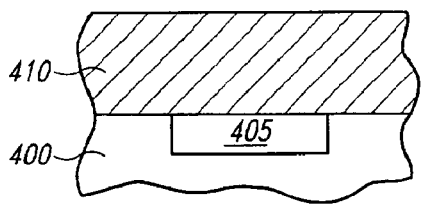

FIGS. 2A–2G illustrate one method of filling a trench and via formed on the surface of a semiconductor wafer wherein the electrochemically deposited copper layer may be applied using the apparatus described in connection with FIG. 1. FIG. 2A illustrates a second assembly 400 having an area 405 that is to be connected by copper metallization. In FIG. 2B a layer 410 of dielectric material, such as silicon dioxide or a low-K dielectric material, is deposited over the second assembly 400 including over area 405. Through a photoresist process and reactive ion etch or the like, selective portions of layer 410 are removed to form, for example, a trench 415 and via 420 into which copper metallization is to be deposited. The end structure is shown in the perspective view of FIG. 2C wherein the via 420 overlies connection area 405 and trench 415 overlies via 420. Connection area 405 may be, for example, a metallization feature above the substrate.

Figure 2E:
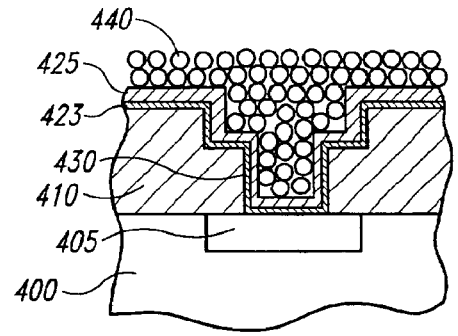
Figure 2C:
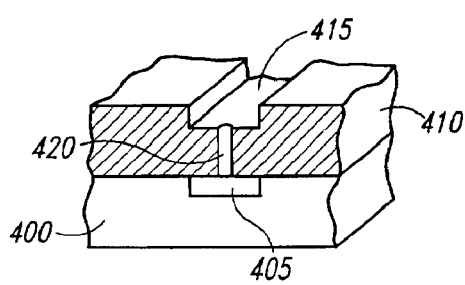
Figure 2F:
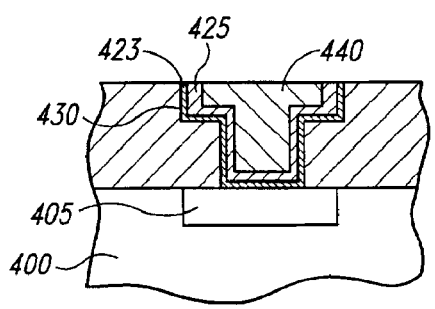
Figure 2D:
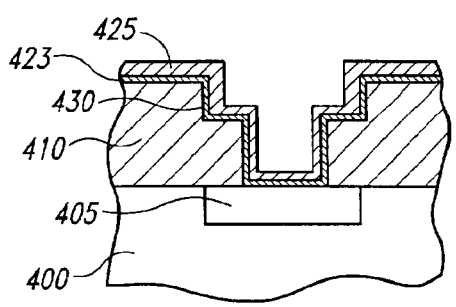
Figure 2G:
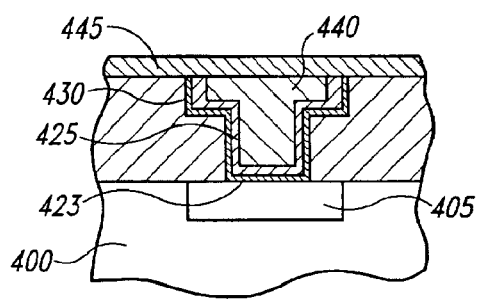

As shown in FIG. 2D, a barrier layer 423 and seed layer 425 may be disposed on the surface of dielectric layer 410. The barrier layer may be, for example, tantalum or titanium nitride. The barrier layer 423 is typically used when the structure 405 is susceptible to contamination from copper or the seed layer metal, and/or when the seed layer metal or copper may readily migrate through the dielectric layer 410 and contaminate other portions of the microelectronic circuit. As such, barrier layer 423 should be sufficiently thick along the contour of the trenches and vias to act as a diffusion barrier. Layer 423 may also function as an adhesion layer to facilitate binding between the seed layer 425 and the dielectric 410. If, however, the structure 405 is not susceptible to such contamination, there is sufficient adhesion, and the dielectric layer 410 itself acts as a barrier layer, then a separate barrier layer 423 may not be necessary. The seed layer 425 may, for example, be a copper layer or other conductive metal layer and is preferably at least 200 Angstroms thick at its thinnest point. Sidewalls 430 of the trench 415 and via 420 as well as the bottom of via 420 should be covered by the seed layer 425 and barrier layer 423 to facilitate a subsequent electrochemical copper deposition step. The seed layer 425 may be deposited through, for example, a CVD or PVD process.

The semiconductor wafer with the seed layer 425 is subject to a subsequent electrochemical copper deposition process. The electrochemical copper deposition process is executed so as to form numerous nucleation sites for the copper deposition to thereby form grain sizes that are substantially smaller than the characteristic dimensions of the via 420 and trench 415. An exemplary structure having such characteristics is illustrated in FIG. 2E wherein layer 440 is a layer of copper metallization that has been deposited using an electrochemical deposition process.

As shown in FIG. 2E, the copper metallization 440 formed in the electrochemical deposition process is deposited over the seed layer 425 and extends a distance above the surface of dielectric layer 410. Since the only features that are to contain the metallization are the via 420 and trench 415, excess copper above the dielectric layer 410 must be removed. Removal of the excess copper above the upper surface of the dielectric layer 410 may be executed using a chemical mechanical polish technique. An exemplary structure in which such removal has taken place is illustrated in FIG. 2F. After such removal, a capping barrier layer 445 may be disposed, for example, over the entire surface of the wafer, or the processes set forth in FIGS. 2A–2F may be repeated without a capping barrier layer 445 whereby the trench 415, now filled with copper metallization, corresponds to the structure 405 that further copper metallization is to contact.

The process illustrated in FIGS. 2A–2G indicates that the via 420 and trench 415 are formed together. However, it will be recognized that the structures may be generally formed and filled separately in accordance with the single-damascene process described above. In such instances, the via 420 is first plated in accordance with the steps set forth in FIGS. 2A–2F while the trench 415 is subsequently plated in accordance with the steps set forth in FIGS. 2A–2F after plating of the via 420 has been completed. In effect, the via 420 corresponds to the structure 405 during plating of the trench 415. The thermal reactor and associated methods disclosed herein are suitable for use in both single-damascene and multi-damascene processes.

A comparison between FIGS. 2E and 2F reveals that an increase in the grain size of the copper layer 440 has taken place. This change in the grain size is purposely accelerated in accordance with the present invention by subjecting the microelectronic workpiece to an annealing process in the thermal reactor disclosed below. In such an annealing process, the wafer is raised to an elevated temperature that is above the ambient temperature conditions normally found in a clean room. The annealing preferably takes place at a temperature at or below about 250–300 degrees Celsius, or at least below the temperature at which the material used for the dielectric layer begins to degrade. Annealing at these temperatures is particularly advantageous when the dielectric layer is formed from a low-K dielectric material since such materials may begin to degrade at elevated temperatures above 300 degrees Celsius.

Annealing is particularly advantageous when used prior to chemical mechanical polishing (CMP). CMP involves the use of mechanical and chemical forces to remove copper that is deposited in excess of what is desired for interconnects (see FIGS. 2E and 2F). In accordance with the present invention, the accelerated annealing process stabilizes the grain structure of the copper film by significantly reducing the amount of time required for film re-crystallization to occur (i.e. transforming many small grains into fewer large grains). The accelerated annealing process, in accordance with the present invention, also minimizes the variation in the grain size distribution which is seen to occur during a room-temperature self-annealing process. The CMP polish rate, or removal rate, is seen to vary as a direct result of the grain size of the copper film. The initial, small grained (i.e. many grain boundaries) films are seen to polish slower (at least with a particular CMP slurry) than large grained films. Similarly, the uniformity of the CMP polish is seen to vary as a direct result of the grain size uniformity of the copper film. Therefore, in accordance with the present invention, the accelerated annealing process reduces the time required for the CMP process, while improving its uniformity, predictability and repeatability.

Figure 3A:
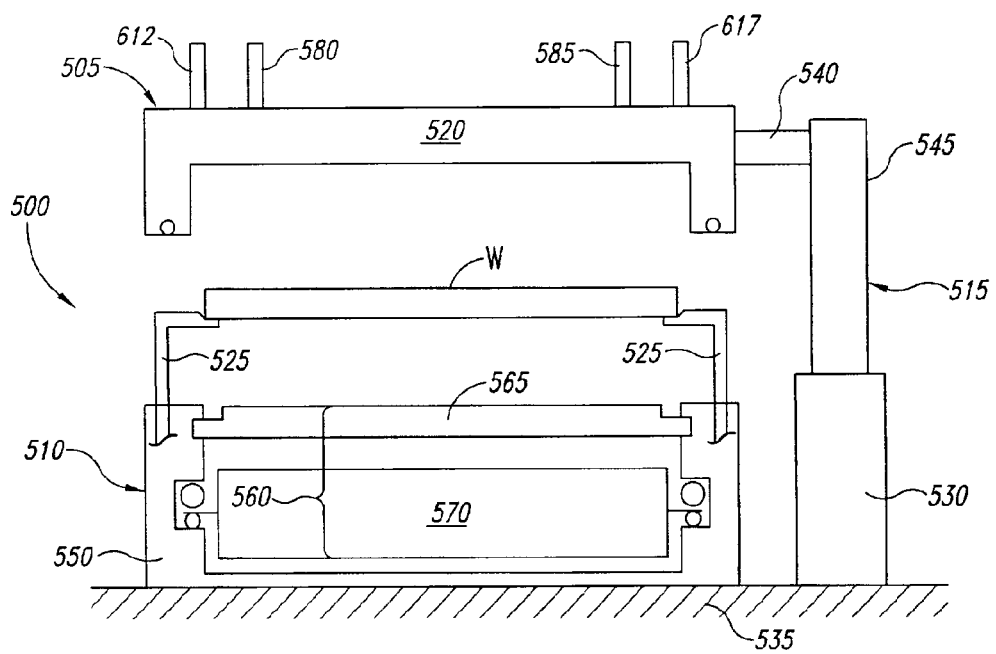
FIGS. 3A–3D are schematic block diagrams of thermal reactors constructed in accordance with two embodiments of the present invention.
Figure 3B:
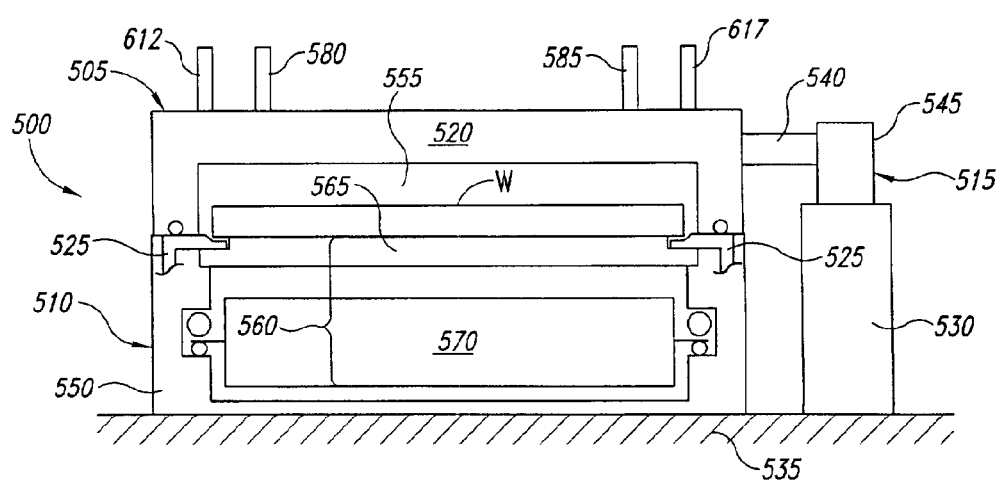

FIGS. 3A and 3B illustrate a thermal reactor, shown generally at 500, that is constructed in accordance with one embodiment of the present invention. Generally stated, the thermal reactor 500 includes a first assembly 505, a second assembly 510, and one or more actuators 515 that are connected to provide relative movement between the first assembly 505 and second assembly 510. The configuration of the thermal reactor 500 shown here may be constructed to occupy a minimal amount of space, thereby making it particularly suitable for incorporation as one of a plurality of processing stations in an integrated microelectronic workpiece processing tool.

In the illustrated embodiment, second assembly 510 includes one or more components 525 that are adapted to receive a single wafer W from an automated wafer transfer mechanism, such as a robot having an end effector that can grasp and release the wafer W. To this end, second assembly 510 may comprise a second assembly housing 550 having an upper rim from which one or more wafer support members 525 extend. Wafer support members 525 may take on a number of different forms. For example, a single wafer support member 525 may be formed as a continuous ring having a lip or the like upon which the wafer W is set by the wafer transfer mechanism. Alternatively, a plurality of wafer support members 525 may be in the form of discrete fingers disposed at various angular positions corresponding to the peripheral edge of the wafer W, the angular positions being chosen to ensure access by the wafer transfer mechanism. Other configurations for the wafer support may likewise be suitable.

Second assembly 510 of the illustrated embodiment has an interior region in which a thermal transfer unit 560 is disposed. Thermal transfer unit 560, in turn, comprises a heater 565 and a cooling chuck 570, the operation of which will be set forth in further detail below. Heater 565 preferably has a relatively low thermal mass so that its temperature response time is fast enough for thermally processing the workpiece within a reasonably defined time period. In contrast, cooling chuck 570 preferably has a high thermal mass when compared to the heater 565 so that the cooling chuck 570 may cool the heater 565 (as will be set forth below) within a reasonably defined time period.

As noted, actuator 515 provides relative movement between the first assembly 505 and the second assembly 510. In the illustrated configuration, actuator 515 is connected to move the first assembly 505 to and from engagement with the second assembly 510. More particularly, actuator 515 includes a lower portion 530 that is in fixed positional alignment with the second assembly 510 since both are secured to a common deck 535. A transversely extending arm 540 extends from an upper portion 545 of the actuator 515 and engages the first assembly 505. Actuator 515 is configured to drive the transversely extending arm 540 and the first assembly 505 between a first position in which the wafer W can be loaded onto the second assembly 510 by an automated wafer transfer mechanism, and a second position in which the first assembly 505 and second assembly 510 are disposed proximate one another to form a space or chamber in which the wafer W is processed.

In operation, actuator 515 initially drives the first assembly 505 to the first position, as illustrated in FIG. 3A. While in this position, the wafer W is placed onto the wafer support members 525 of the second assembly 510 by an automated wafer transfer mechanism, such as an articulated robot having an end effector carrying the wafer W.

Once the wafer W has been loaded onto wafer supports 525, actuator 515 drives first assembly 505 toward second assembly 510 to the second position illustrated in FIG. 3B. The wafer support members 525 translate congruently with the first assembly 505, through contact with the lower surface of the first assembly 505 or through independent actuation. As illustrated in FIG. 3B, the wafer W is deposited directly onto the surface of thermal transfer unit 560, where it will be thermally processed. Generally, the upper surface of wafer W will be the device side of the workpiece while the non-device, lower surface of wafer W will be placed in contact with the upper surface of thermal transfer unit 560. To secure wafer W to the upper surface of thermal transfer unit 560 during processing, thermal transfer unit 560 may include one or more apertures (described in detail below) that are connected to a vacuum that suctions the lower surface of wafer W against the upper surface of thermal transfer unit 560.

In the position of FIG. 3B, the lower portion of housing 520 may engage the upper portion of second assembly housing 550 to form a thermal processing chamber 555, which may or may not be substantially gas-tight. When the thermal reactor 500 is used, as here, for annealing the workpiece, the thermal processing chamber 555 is continuously purged with an inert gas to minimize the level of any oxidizing agents that may form an undesirable oxide with the copper. To facilitate this purge, first assembly 505 may be provided with one or more gas inlet ports 580 and one or more gas outlet ports 585. Gas inlet port 580 may open to a manifold in housing 520 that, in turn, opens to a plurality of holes disposed through a lower surface of housing 520. Gas mixtures that are particularly suitable for reducing oxidizing agents in the processing chamber 555 include nitrogen or hydrogen forming gases (5% hydrogen/95% argon). The inert process environment inhibits surface film oxidation of the wafer at elevated temperatures, which can be enhanced by the oxygen-gettering effects of hydrogen forming gas. In processes other than annealing, ports 580 and 585 may be used to provide an inlet and outlet for other gases used to process wafer W.

Other enhancements may be incorporated into the thermal reactor 500 to make it particularly well-suited for single workpiece annealing. For example, the volume of the processing chamber 555 formed by the cooperation of the first assembly 505 and second assembly 510 may be minimized, which makes it more efficient to purge and, thereby, minimizes the consumption of high-purity, inert process gas. In addition, first assembly 505 may be provided with one or more cooling fluid inlet ports 612 and one or more cooling fluid outlet ports 617 that provide a flow of cooling fluid to a lower surface of the housing 520 proximate wafer W that, in turn, assists in cooling the wafer W. Still further, the first assembly housing 520 may contain internal flow channels for re-circulating fluid, to maintain the lower surface of the housing 520 at a specified temperature.

It will be recognized that various fluid inlet and outlet ports may also be affixed to the second assembly 510. For example, fluid ports may be affixed to the second assembly for use in connection with the cooling chuck 570. More particularly, a flow of cooling fluid may be provided directly to the cooling chuck or to other structures of the second assembly for cooling of the cooling chuck 570. Furthermore, one or more exhaust ports may be disposed in the second assembly for supply and/or venting of process gases. This arrangement in which the ports are affixed to the second assembly has the benefit of minimizing the amount of movement imparted to the ports and corresponding connectors, thereby increasing in the overall reliability of the corresponding connections.

Figure 3C:
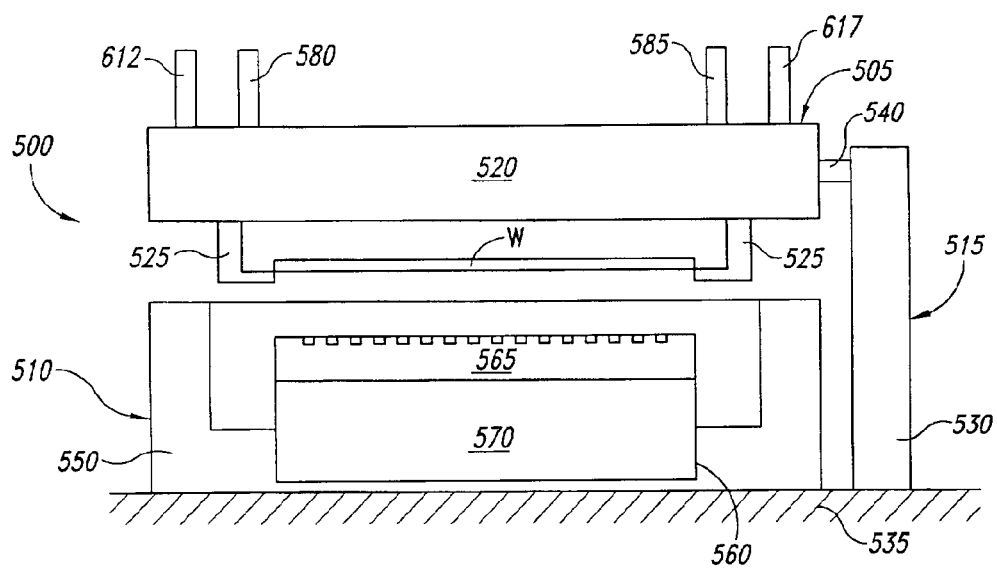
Figure 3D:
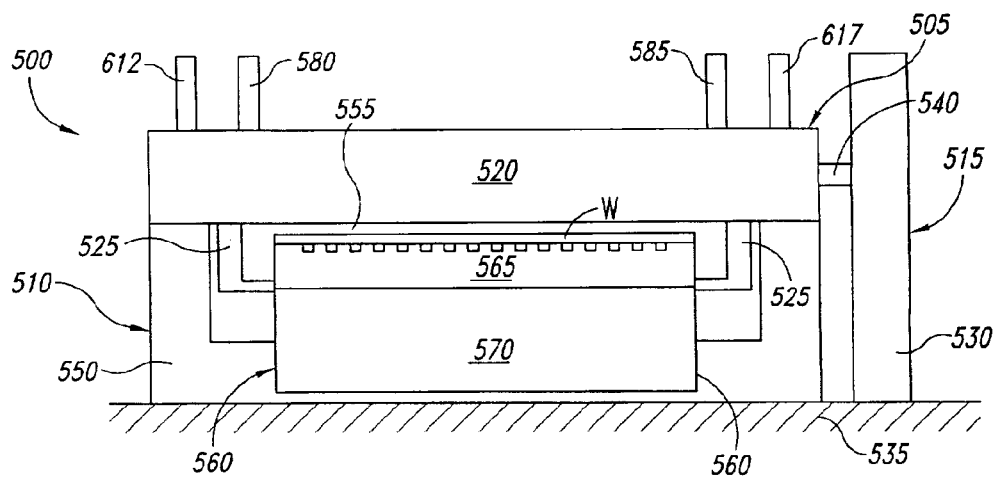

FIGS. 3C and 3D illustrate a further embodiment of a thermal reactor constructed in accordance with the present invention. In many respects, this embodiment is somewhat similar to the embodiment set forth above in connection with FIGS. 3A and 3B. They differ, however, in that the wafer supporting components are disposed on the first assembly 505 as opposed to the second assembly 510. As such, an automated robot servicing the thermal reactor embodiment of these figures is controlled to place and remove the workpiece to and from the first assembly 505 when the first and second assemblies are in the relative wafer loading position.

In each of the foregoing reactor embodiments, once the wafer W is secured to the thermal transfer unit 560 and the processing chamber 555 has been purged, the heater 565 of thermal transfer unit 560 is directed to ramp up to the target process temperature. Preferably, heating power is provided to heater 565 in the form of electrical energy by a controller using one or more temperature feedback signals for closed-loop control. The wafer W is then held at the processing temperature for a specified length of time. After the expiration of the specified length of time, power is shut off to the heater 565 and the cooling chuck 570 is engaged. In accordance with one manner in which the cooling process takes place, the cooling chuck 570 remains engaged until the temperature drops below a predetermined temperature threshold, such as 70 degrees Celsius, after which the cooling chuck 570 may be disengaged. As such, the wafer W is cooled to a temperature that allows it to be safely handled by the wafer transfer mechanism as well as in subsequent processing chambers. Further, the wafer W is cooled to a temperature at which the electroplated metal is less susceptible to oxidizing agents in the ambient atmosphere before it is removed from the inert atmosphere of the processing chamber 555.

Upon completion of the cool-down cycle, the vacuum circuit that is used to secure wafer W against thermal transfer unit 560 is deactivated and the actuator 515 drives first assembly 505 back to the position illustrated in FIG. 3A or FIG. 3C, depending on the particular embodiment. As the first assembly 505 is raised in the embodiment of FIGS. 3A and 3B, wafer support members 525 naturally engage or are otherwise directed to engage and lift wafer W from the surface of the thermal transfer unit 560. The automated wafer transfer mechanism then removes wafer W from wafer support members 525, thereby leaving the thermal reactor 500 ready for accepting and processing another wafer W. While thermal reactor 500 is waiting to accept another wafer W, heater 565 may be directed to begin ramping to the desired processing temperature, or some intermediate temperature, to thereby reduce the overall time required to thermally process the next microelectronic workpiece. Similarly, wafer support members 525 of the embodiment shown in FIG. 3C are directed to release the wafer W to the automated wafer transfer mechanism thereby leaving the reactor 500 in a state in which it is ready to receive a further wafer.

FIGS. 4A–4F illustrate different embodiments of the heater 565, employing different substrate configurations. Preferably, heater 565 is constructed as a thick film heater (i.e., a heater that is constructed using thick film patterning techniques) having a low thermal mass. Each thick film heater 565 configuration can accommodate a high power density within a thin physical profile, resulting in a low thermal mass with fast thermal response (i.e. faster heating and cooling). Given the low thermal mass of such thick film heater configurations, the thick film heater 565 should be thermally isolated from other structures in the second assembly 510.

Figure 4A:
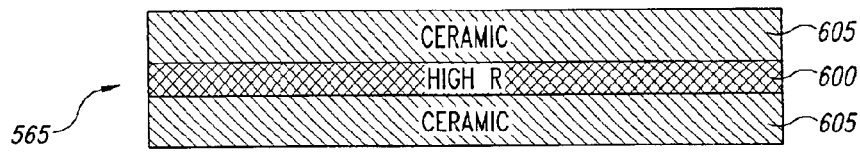
FIGS. 4A–4F are a cross-sectional view of four embodiments of a thick film heater that may be used in the thermal transfer unit of the embodiments of the thermal reactor shown in FIGS. 3A through 3D.

FIG. 4A illustrates a basic thick film heater. As shown, the thick film heater 565 is comprised of a high resistance layer 600 that is disposed between two ceramic substrate layers 605.

Figure 4B:
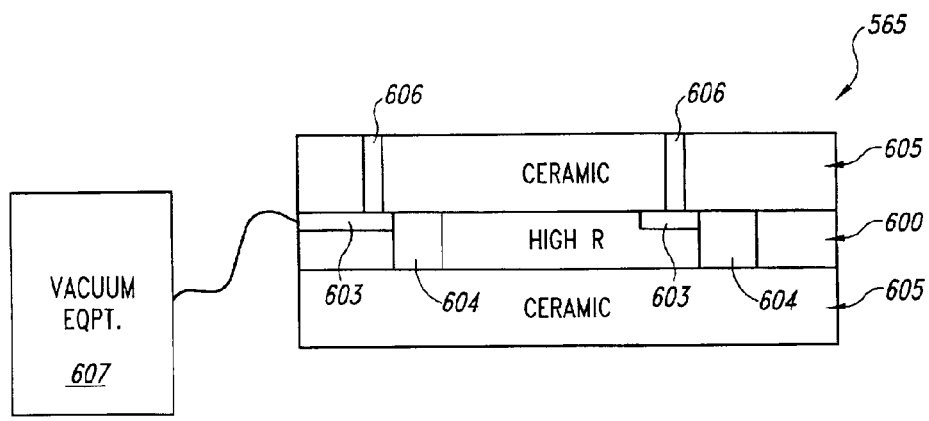

FIG. 4B illustrates a further construction of the thick film heater 565. As shown, thick film heater 565 may be fabricated by forming a layer 600 having a circuit pattern of high resistance traces 604 between two or more thin ceramic substrates 605, with optional vacuum distribution circuit channels 603 embedded between the high electrical resistance traces 604. When employed, the vacuum distribution circuit channels 603 are connected to an exterior vacuum supply 607. The high resistance traces 604 may be formed in a pattern that tailors the power distribution to the shape of the microelectronic workpiece so that the workpiece is uniformly heated. The optional vacuum circuit channels 603 are connected to apertures 606 in the top substrate layer, thereby providing suction to the lower surface of the microelectronic workpiece. The embodiments illustrated in FIGS. 4A and 4B are particularly suited for those instances in which a ceramic interface is desired between the heater 565 and the cold chuck 570.

Figure 4C:
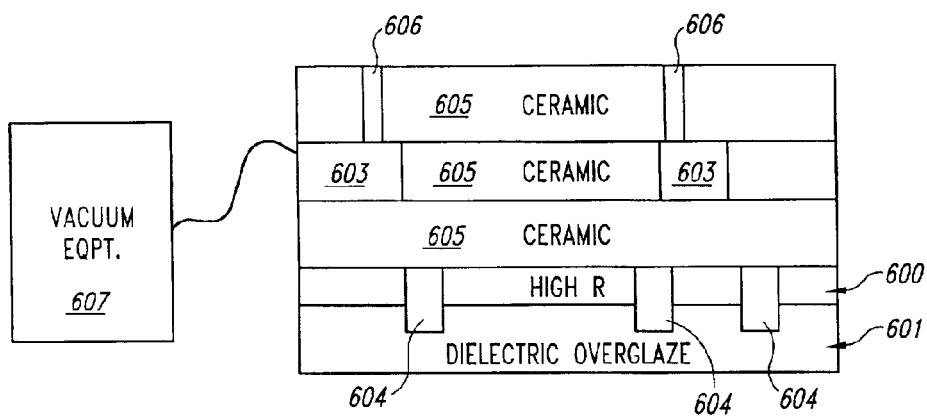

FIG. 4C illustrates a third manner in which the thick film heater 565 may be constructed. As shown, the thick film heater 565 may be fabricated with two or more layers of thin ceramic substrate 605 that sandwich a layer of vacuum circuit channels, with a layer of high electrical resistance traces 600 deposited onto the bottom surface of the thick film heater 565. A layer of dielectric overglaze 601 is deposited over the high electrical resistance traces 604 for protection and electrical isolation. This embodiment is relatively easy to manufacture since the vacuum distribution channels 603 may be cut completely through the second ceramic layer 605 and have the rear side thereof sealed by a lower, adjacent ceramic layer.

Figure 4D:
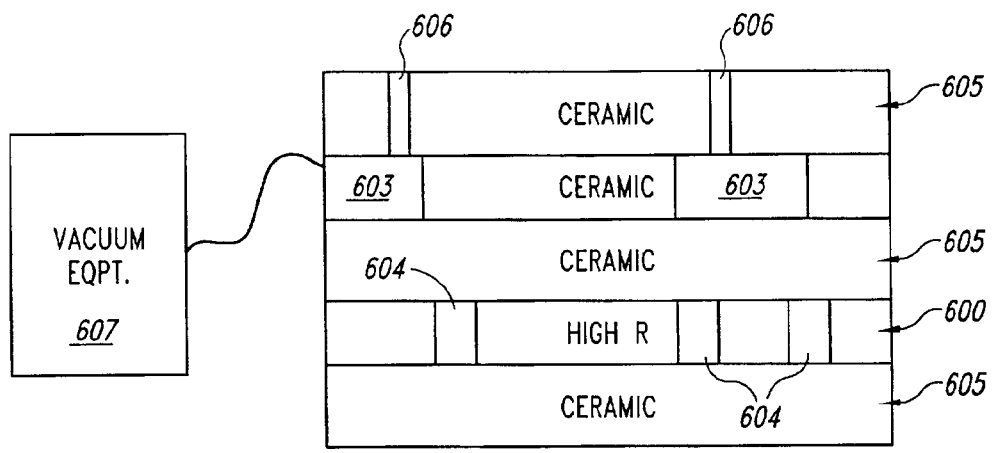

FIG. 4D illustrates a fourth manner in which the thick film heater 565 may be constructed. As shown, thick film heater 565 may be fabricated with three or more laminated layers of thin ceramic substrate 605 that sandwich a layer of vacuum circuit channels between two or more thin ceramic substrates 605, and a lower layer of high electrical resistance traces 600 between a different pair of ceramic substrates 605. Again, this embodiment is relatively easy to manufacture since the vacuum distribution channels 603 are cut completely through the second ceramic layer and are sealed by a lower, adjacent ceramic layer. Further, this embodiment is particularly well-suited for those instances in which it is desired to have a ceramic interface between the heating chuck 565 and the cold chuck 570.

Figure 4E:
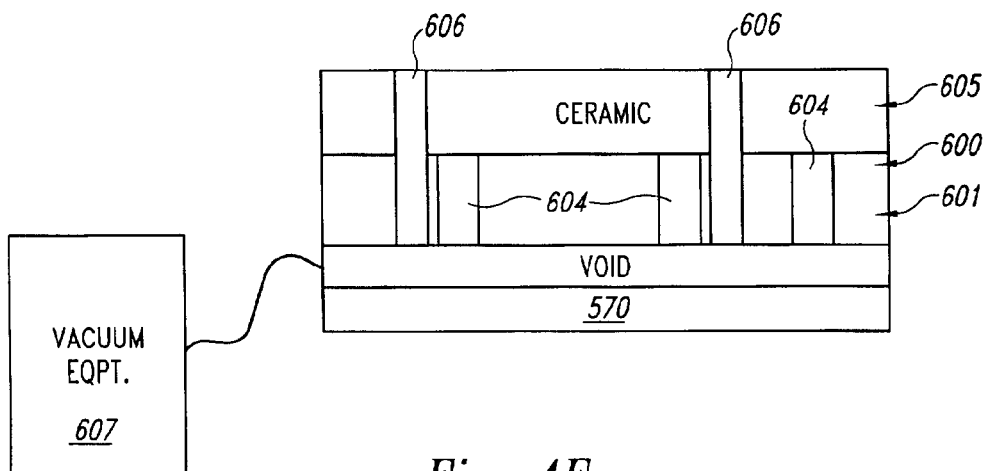

FIG. 4E illustrates a fifth manner in which the thick film heater 565 may be constructed. As shown, thick film heater 565 may be fabricated with one layer of thin ceramic substrate 605, with a layer of high electrical resistance traces 600 deposited onto the bottom surface of the thick film heater 565. A layer of dielectric overglaze 601 is deposited over the high electrical resistance traces 604 for protection and electrical isolation. The void between the bottom surface of the thick film heater 565 and the top surface of the cooling chuck 570 serves as a vacuum reservoir for the apertures 606 that extend through the thick film heater 565.

Figure 4F:
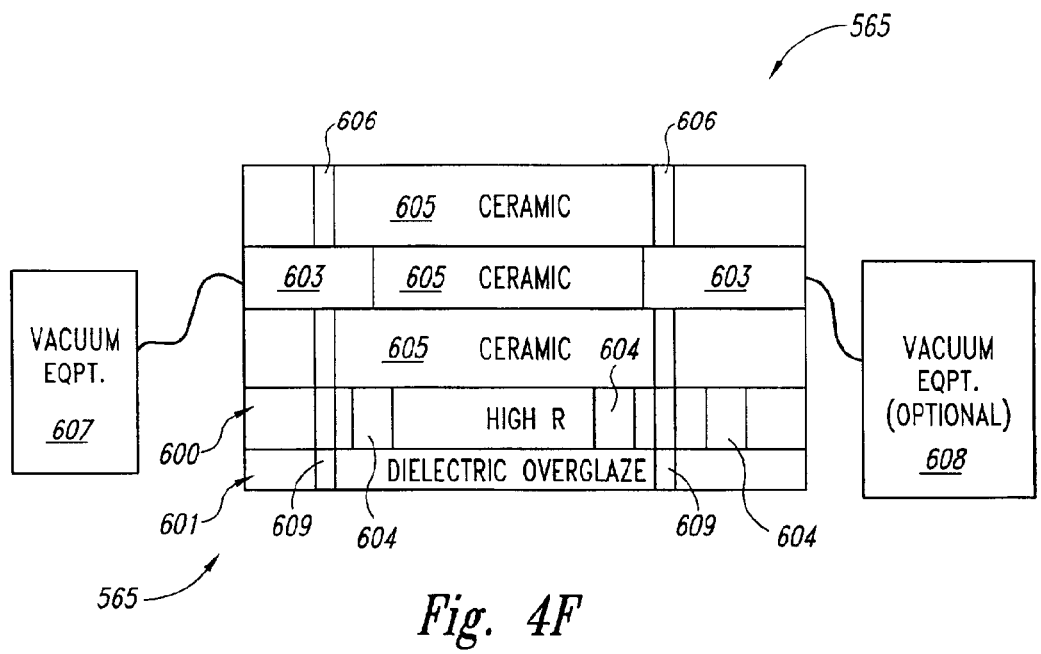

FIG. 4F illustrates an embodiment of heater 565 that may be used to provide good thermal contact between the upper surface of heater 565 and the wafer W during a heating cycle and the lower surface of the heater 565 and the cooling chuck 570 during a cooling cycle. To this end, the second of the ceramic layers 605 is provided with at least one set of vacuum distribution channels 603a. The vacuum distribution channels 603 are in fluid communication with one or more apertures 606 disposed through the upper ceramic substrate that is used to contact the wafer W. The vacuum distribution channels 603 are also in fluid communication with one or more apertures 609 disposed through a lower surface of the heater 565. Vacuum equipment 607 operates during both the heating and the cooling cycles. During the cooling cycle, the vacuum provided through apertures 609 assists in establishing thermal contact between the lower surface of the heater 565 and the cooling chuck 570.

Alternatively, separate vacuum distribution channels 603 may be connected to separately operable vacuum sources 607 and 608. In such instances, the first vacuum source and corresponding vacuum distribution channels may be used to bring the wafer W into firm thermal contact with the upper surface of the heater 565 while the second vacuum source and corresponding vacuum distribution channels may be used to bring the cooling chuck 570 into firm thermal contact with the lower surface of the heater 565 during a cooling cycle.

Figure 4G:
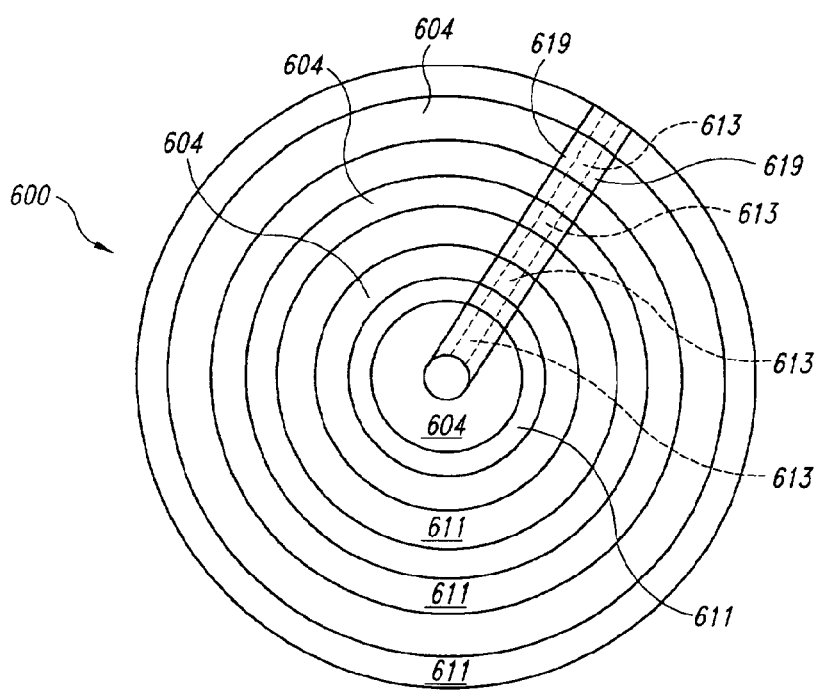
FIGS. 4G–4J are plan views of various elements that form the thick film heater constructions illustrated in FIGS. 4A–4F.

FIGS. 4G–4J are exemplary plan views of various elements used in the thick film heaters shown in FIGS. 4B–4F. FIG. 4G is a plan view of an exemplary layout for the high resistance layer 600. As illustrated, the exemplary layout comprises a plurality of concentric high resistance traces 604 that are separated from one another by corresponding concentric isolation regions. Isolation regions 611 may be comprised of a dielectric material, such as ceramic or air. When air is used as the dielectric material, isolation regions 611 may be used as the vacuum distribution channels 603 of an embodiment such as the one illustrated in FIG. 4B. Each of the high resistance traces 604 includes electrical nodes that are isolated from one another by corresponding isolation regions 613. Isolation regions 613 may be comprised of a dielectric material, such as ceramic or air. Additionally, the conductors 604 may be provided with power on an individual basis, or may be provided with power supplied on a common power bus 619.

Figure 4H:
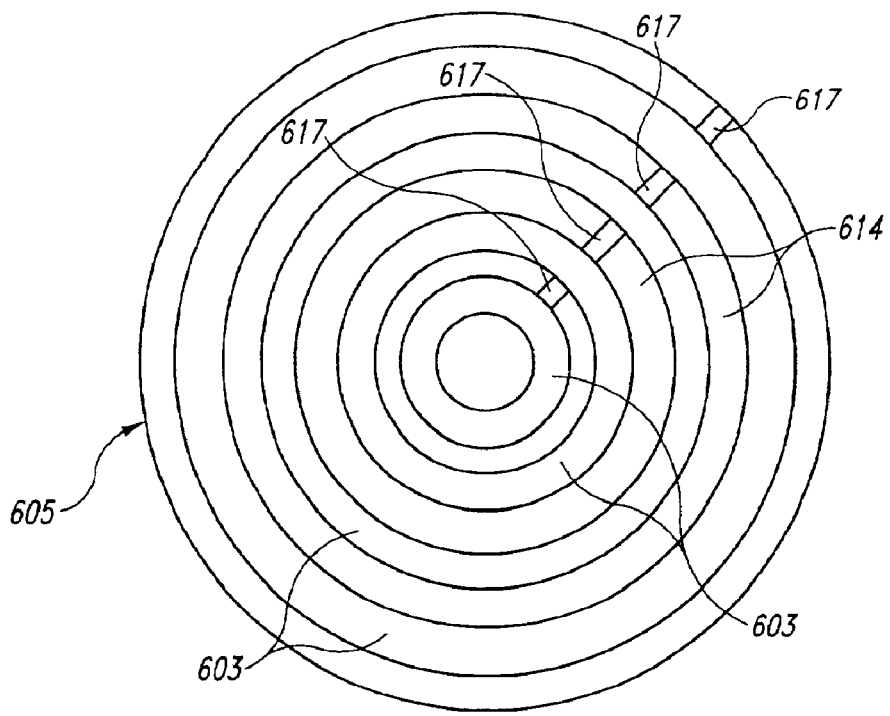

FIG. 4H is an exemplary plan view of the layout of vacuum distribution channels 603 formed in the second ceramic layer 605 of an embodiment such as the one illustrated in FIGS. 4C, 4D and 4F. Again, the vacuum distribution channels 603 are formed in a concentric arrangement that are generally isolated from one another by corresponding isolation regions 614. Isolation regions 614 include one or more fluid passage channels 617 that provide areas of fluid communication between the distribution channels 603 so that the vacuum provided by a vacuum source connected to one or more of the distribution channels 603 may be communicated to all of the distribution channels.

Figure 4I:
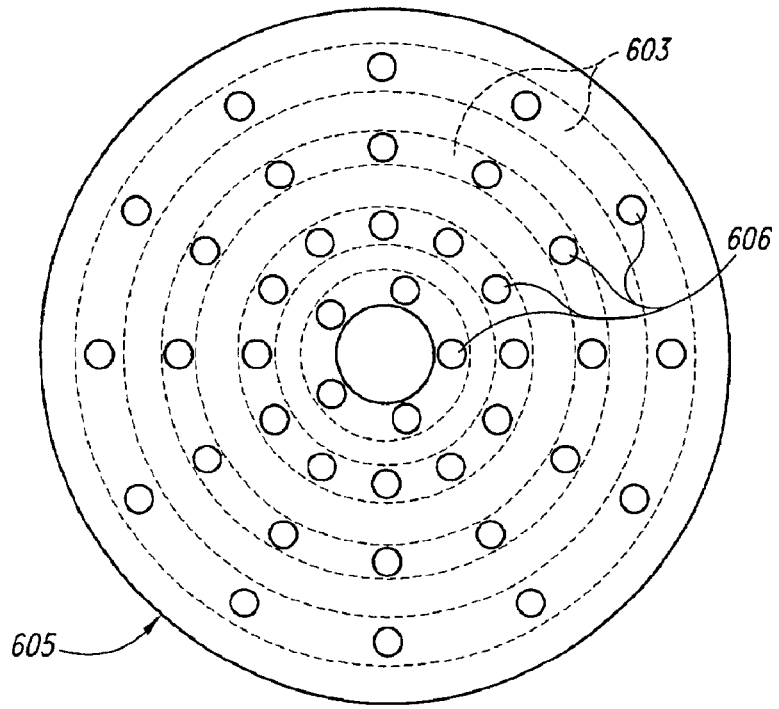

FIG. 4I is a top plan view of an exemplary layout for the uppermost ceramic layer 605. As illustrated, apertures 606 may be formed in the upper ceramic layer 605 at locations disposed immediately above the vacuum flow channels 603 (shown in phantom outline). With respect to the exemplary layout shown here, the apertures 606 are arranged in concentric circles at equal angular intervals.

Figure 4J:
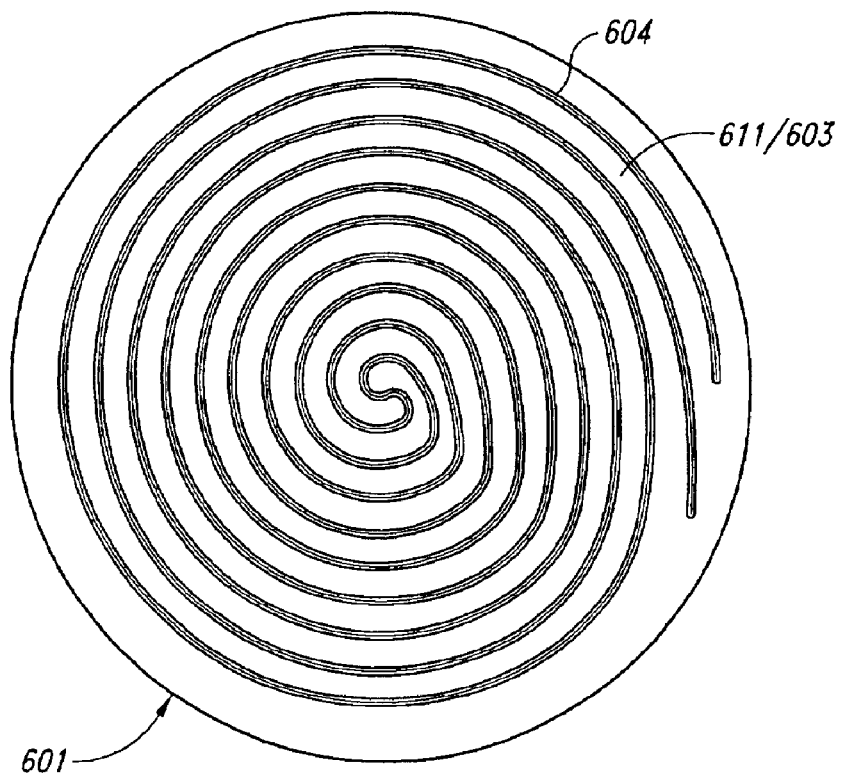
Figures 5A, 5B:
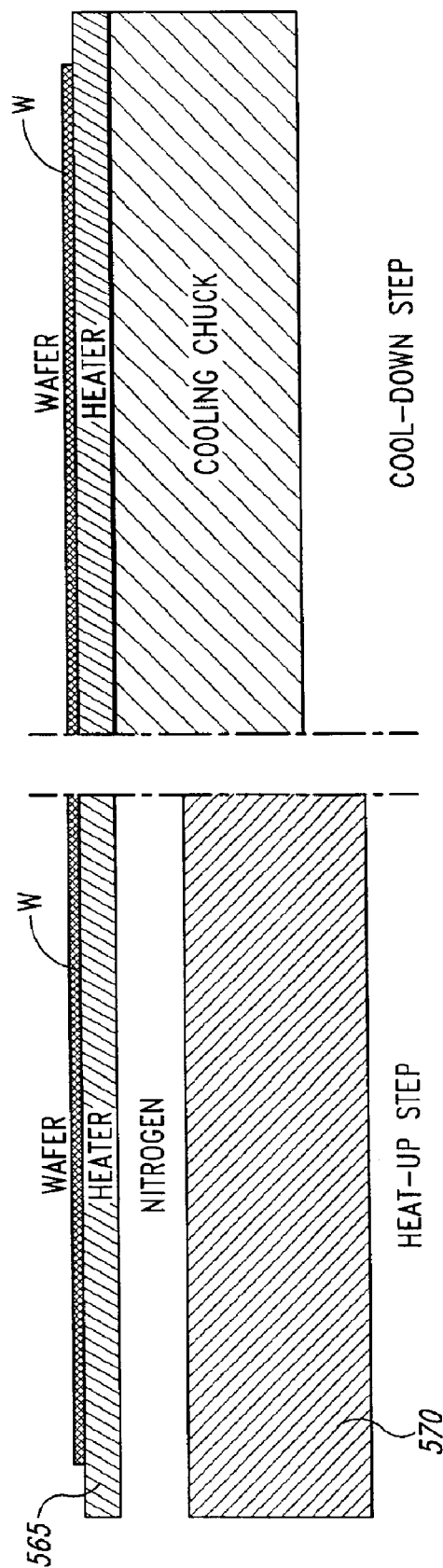
FIGS. 5–8 illustrate various manners in which the thick film heater and the cooling chuck may cooperate with one another in the embodiment of the thermal transfer unit.

FIG. 4J illustrates a further configuration for the high resistance traces 604. As shown, the traces 604 are organized in the form of a continuous spiral separated by a isolation regions 611 that, as noted above, can be formed from a solid dielectric material or air. When air is employed, regions 611, in certain of the foregoing embodiments, can function as the vacuum flow channels 603.

FIGS. 5–8 illustrate various embodiments of the thermal transfer unit 560 employing different interfaces between the thick film heater 565 and cooling chuck 570. In the embodiment shown in FIGS. 5A and 5B, solid/solid conduction is used as the primary mode of heat transfer from the thick film heater 565 to the cooling chuck 570 as well as for the heat transfer between the heater 565 and wafer W. During thermal processing of the wafer W, the thermal transfer unit 560 is in the heating state illustrated in FIG. 5A. In the heating state, the top surface of cooling chuck 570 is offset from the lower surface of the thick film heater 565 and the volume between them is filled with a relatively low thermal conductivity gas, such as nitrogen, which thermally insulates the elements from one another. Isolating the thick film heater 565 from the cooling chuck 570 in this manner facilitates a fast heat up to the desired process temperature, because there is minimal heat loss. The cool-down state is illustrated in FIG. 5B. In this state, the thick film heater 565 is deactivated and the thick film heater 565 and cooling chuck 570 are moved relative to one another so that the lower surface of thick film heater 565 engages the upper surface of cooling chuck 570. Such relative movement may be provided, for example, by opposing inflatable, flange seals that are actuated to impart vertical movement to the cooling chuck 570.

Figures 6A, 6B:
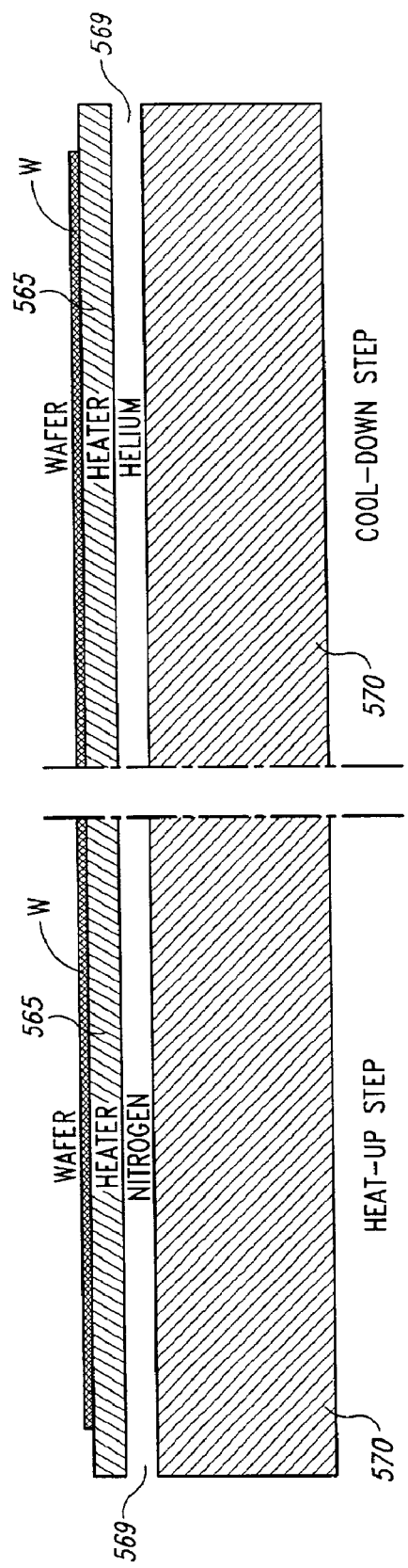

FIGS. 6A and 6B illustrate an embodiment of the thermal transfer unit 560 in which solid/gas/solid conduction is used as the primary mode of heat transfer from the thick film heater 565 to the cooling chuck 570. In this embodiment, the thick film heater 565 and cooling chuck 570 are permanently offset from one another by a very small distance (i.e., 0.020 inches). While in the heating state illustrated in FIG. 6A, the volume 569 between the thick film heater 565 and the cooling chuck 570 is purged with a relatively low thermal conductivity gas to thermally insulate the elements from one another. When in the cooling state illustrated in FIG. 6B, the thick film heater 565 is deactivated and the volume 569 between the thick film heater 565 and the cooling chuck 570 is purged with a relatively high thermal conductivity gas, such as helium, which serves as the medium for conducting heat from the thick film heater 565 to the cooling chuck 570. This approach provides efficient use and transfer of thermal energy, with no moving parts. Notably, inlet and outlet ports for the gases must be provided in thermal reactor 500.

Figure 7B:
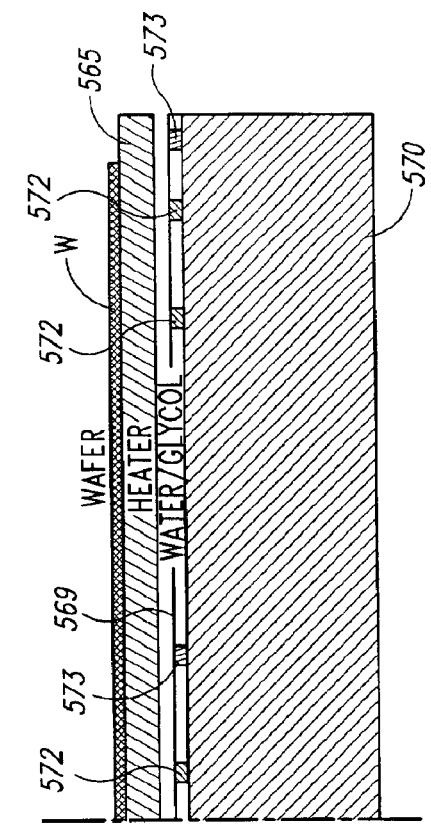
Figure 7A:
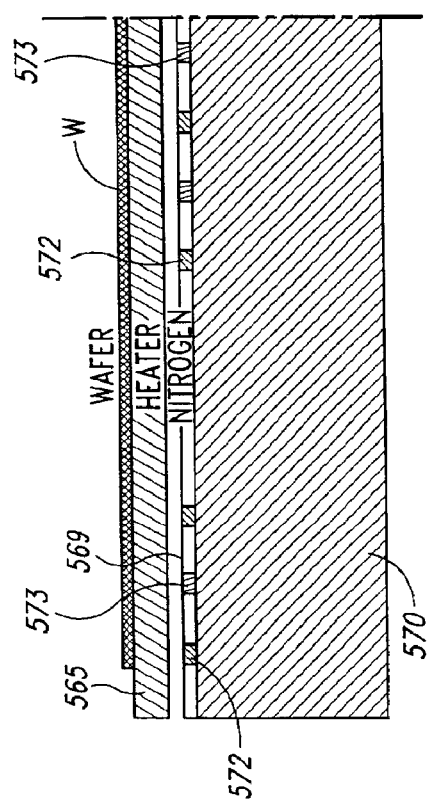

FIGS. 7A and 7B illustrate an embodiment of thermal transfer unit 560 that makes use of forced convection and boiling as the primary modes to transfer heat from the thick film heater 565 to the cooling chuck 570. Again, the thick film heater 565 and cooling chuck 570 are permanently offset from one another by a small distance (i.e., 0.020–0.040 inches). While in the heating state illustrated in FIG. 7A, the volume 569 between the thick film heater 565 and cooling chuck 570 is purged with a relatively low thermal conductivity gas to thermally insulate the elements from one another. When in the cooling state illustrated in FIG. 7B, the thick film heater 565 is deactivated and the volume 569 between the heating chuck 565 and the cooling chuck 570 is filled with an impinging, high-speed flow of heat transfer fluid (i.e., water or glycol), which serves as the medium for convecting heat away from the thick film heater 565 to the cooling chuck 570. The cooling chuck 570 in this instance may be formed to serve as a sparger shower assembly, uniformly delivering the heat transfer fluid through a manifold of flow jet apertures 572 in the upper surface of the cooling chuck, and locally draining the fluid through an interspersed manifold of exit holes 573. Alternatively, spent cooling fluid may be directed to exit radially in the channel between the heating and cooling chucks. This overall approach provides efficient use and transfer of thermal energy, again with no moving parts.

Figure 8B:
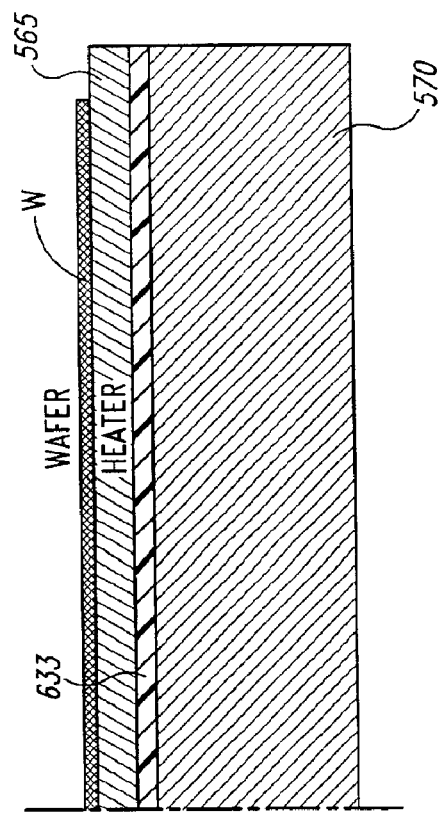
Figure 8A:
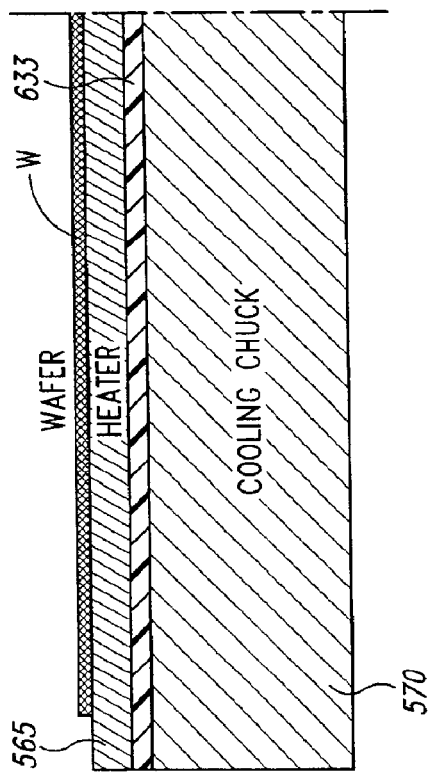

FIGS. 8A and 8B illustrate yet a further embodiment of the thermal transfer unit 560. In this embodiment, the wafer W, thick film heater 565 and cooling chuck 570 are in constant contact during the entire thermal processing cycle. A thin layer of insulating material 633 is used to thermally insulate the thick film heater 565 from the cooling chuck 570. The material used for layer 633 and the thickness thereof are chosen to yield an optimal balance between the performance of the thermal transfer unit 560 that is exhibited during the heating and cooling sub-cycles of the overall thermal processing cycle. This design offers the advantage of design simplicity, in that there are no moving parts and no thermally insulating/conducting gases needed.

In each of the foregoing embodiments in which the cooling chuck 570 directly contacts the heater 565, an optional, high thermal conductivity material may be disposed between the contact surfaces during the cooling cycle. The material disposed between the contact surfaces preferably is resiliently deformable in response to the pressure applied when the heater 565 and cooling chuck 570 are in direct thermal contact with one another. In this way, a more uniform thermal transfer medium exists between the heater 565 and cooling chuck 570 since air pockets or the like that may otherwise occur if the heater 565 and cooling chuck 570 surfaces were in direct physical contact are substantially eliminated.

Figure 9:
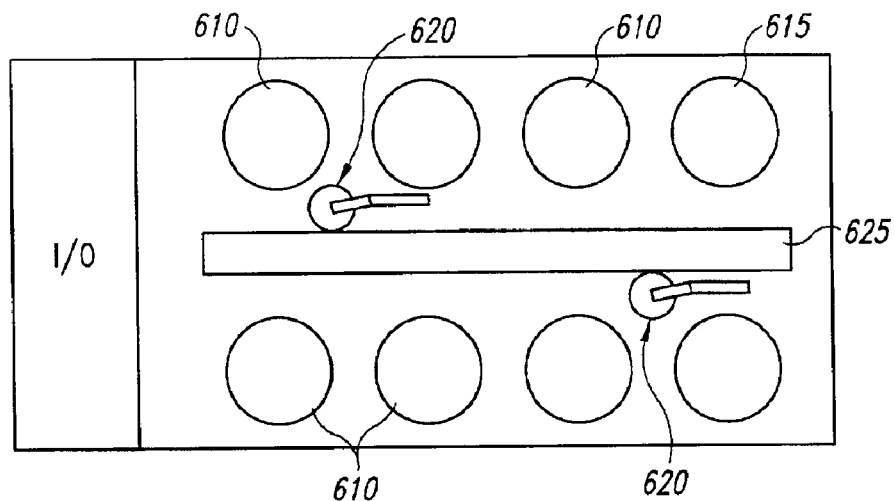
FIGS. 9 and 10 are schematic diagrams of wet chemical processing tool sets that include one or more annealing stations having thermal reactors constructed in accordance with the present invention.
Figure 10:
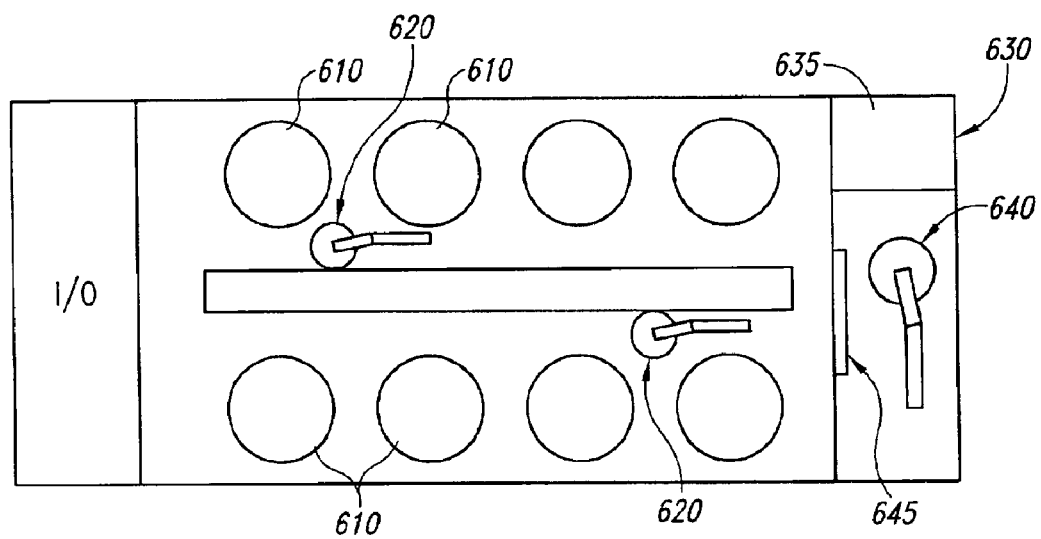

Due to its ready implementation in a compact architecture, thermal reactor 500 may be integrated with a wet-chemical processing tool that is capable of electrochemical deposition of a metal, such as copper. One such processing tool is the LT-210™ electroplating apparatus available from Semitool, Inc., of Kalispell, Mont. FIGS. 9 and 10 illustrate such integration.

The system of FIG. 9 includes a plurality of processing stations 610. Preferably, these processing stations include one or more rinsing/drying stations and one or more electroplating stations (including one or more electroplating reactors such as the one illustrated in FIGS. 1A and 1B), although further wet-chemical processing stations may also be employed. The system also preferably includes an annealing station, such as at 615, that includes at least one thermal reactor, constructed in accordance with one or more of the foregoing embodiments, for executing an annealing process on each workpiece. The workpieces are transferred between the processing stations 610 and the annealing station 615 using one or more robotic transfer mechanisms 620 that are disposed for linear movement along a central track 625.

FIG. 10 illustrates a further manner in which an annealing station 635, located in portion 630, that includes at least one thermal reactor, may be integrated in a wet-chemical processing tool set. Unlike the embodiment of FIG. 9, in this embodiment, at least one thermal reactor is serviced by a dedicated robotic mechanism 640. The dedicated robotic mechanism 640 accepts workpieces that are transferred to it by the robotic transfer mechanisms 620. Transfer may take place through an intermediate staging door/area 645. As such, it becomes possible to hygienically separate the annealing portion 630 of the processing tool from other portions of the tool. Additionally, the illustrated annealing station may be implemented as a separate module that is attached to upgrade an existing tool set.

Figure 11:
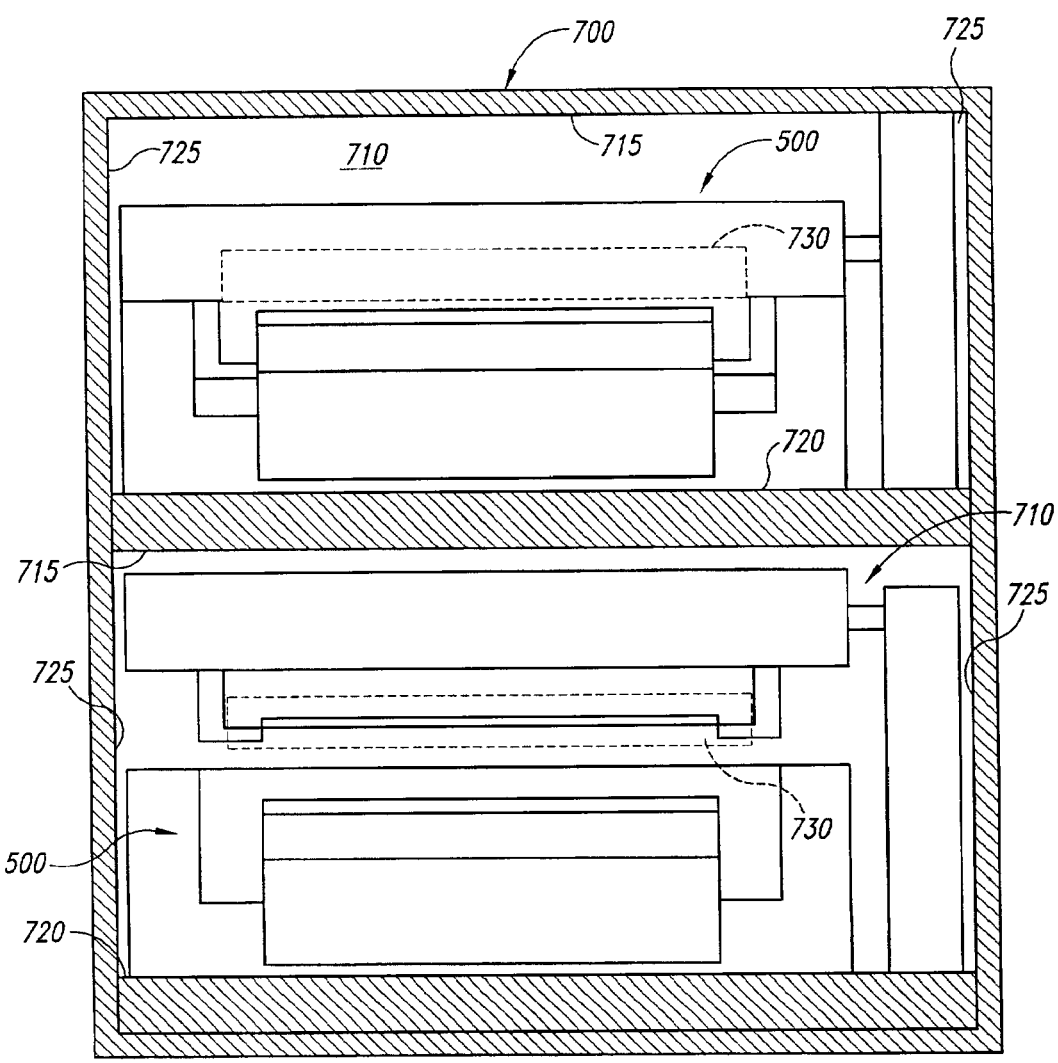
FIG. 11 illustrates one manner in which a plurality of thermal reactors of the type shown in FIGS. 3A through 3D may be integrated into a single annealing station.

FIG. 11 illustrates one manner in which two or more thermal reactors constructed in accordance with one or more of the foregoing embodiments may be consolidated at a single annealing station, such as at station 615 of FIG. 9 and station 635 of FIG. 10. In this embodiment, the thermal reactors are disposed in a stacked configuration within a housing unit 700. Housing unit 700 includes a plurality of chamber units 710, each including a single thermal reactor. The chamber units 710 are defined by upper and lower horizontal walls 715 and 720, and one or more sidewalls 725. One or more sidewalls 725 of each chamber unit 710 may include an automated door or mail slot opening 730 that isolates each chamber unit 710 from the surrounding environment and provides the wafer transfer mechanism with access to the thermal reactors during wafer loading and unloading operations. Processed wafers may be transferred directly to a chemical mechanical polishing tool from either of the processing tools of FIGS. 9 and 10.

Figure 12:
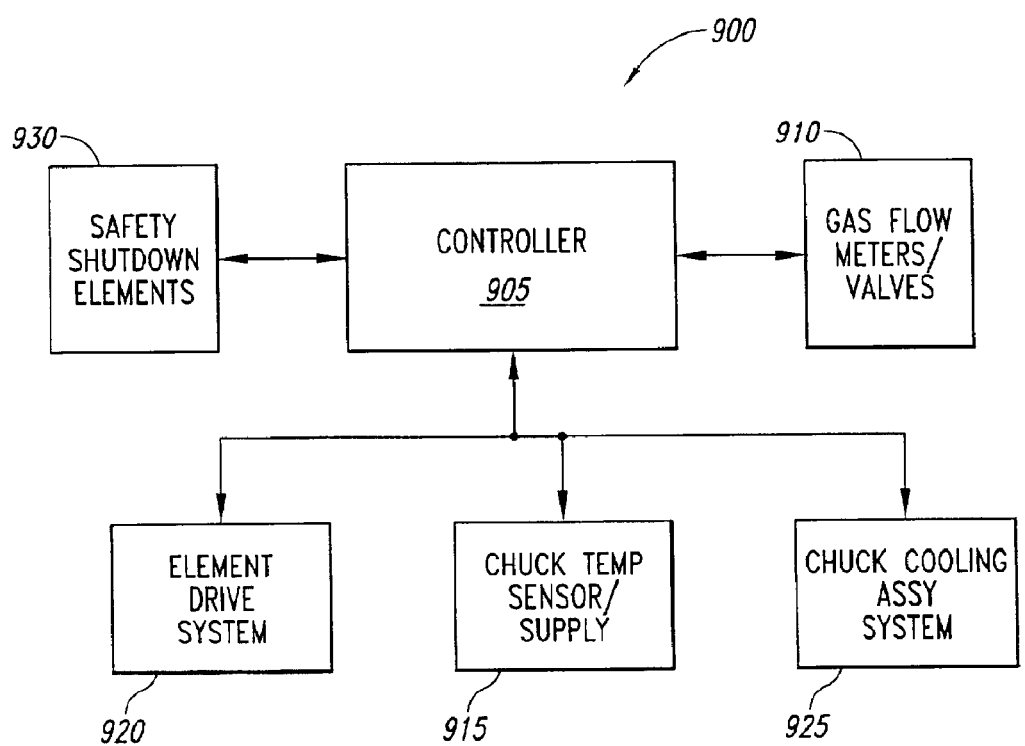
FIG. 12 illustrates one embodiment of a programmable control system that may be used to coordinate the operation of the thermal reactor.

FIG. 12 is a schematic block diagram of one embodiment of a programmable control system that may be used to control the thermal reactor assembly in accordance with a further aspect of the present invention. The control system, shown generally at 900, comprises a programmable controller 905, such as a programmable logic controller, microcontroller, microprocessor, etc. Controller 905 receives data and communicates data to and from a plurality of peripheral components that are used to monitor and control the thermal reactor. For example, controller 905 is in communication with an automated gas flow meters/valve system 910. The automated gas flow meters/valve system 910 controls the flow of various gases, such as the purging gases, that are provided to the thermal reactor. The automated gas flow system 910 may also be used to control the operation of the vacuum equipment 607 and/or 608 shown in FIGS. 4B–4F, turning the equipment on and off at the appropriate times.

Control of the annealing temperature within the thermal reactor may also be controlled by the controller 905 through a corresponding interface with a chuck temperature sensor/supply system 915. The chuck temperature sensor/supply system 915 includes a plurality of temperature sensors that are used to monitor the temperature within the thermal reactor. The system 915 also comprises a power supply that provides the necessary electrical power to the electrical traces 604 (FIGS. 4A–4F) of the high resistance layer in response to data communicated from the controller 905. Various known temperature control algorithms may be employed within the programmable controller 905 to facilitate this function.

Element drive system 920 and chuck cooling assembly 925 are used to operate the drive 530 (FIGS. 3A–3D) and the cooling chuck 570, respectively. More particularly, drive system 920 operates the drive 530 to move the first and second assemblies 510, 520 with respect to one another for loading/unloading and processing of the wafer W in response to commands received from programmable controller 905. The drive system 920 may also communicate positional information to the controller 905 indicative of the relative position of the first and second assemblies 510, 520, which may be used by the controller 905 to properly position the assemblies during operation of the thermal reactor.

Chuck cooling assembly system 925 may serve a dual purpose. First, the system 925 may be used to control the relative movement between the heating chuck 565 and cooling chuck 570 in response to commands received from the controller 905. Further, system 925 may be used to control the temperature of the cooling chuck 570 by controlling the cooling gases provided to the cooling chuck in response to commands received from the controller 905. To this end, system 925 may also include one or more temperature sensors that monitor the temperature of the cooling chuck 570 and transmit data to the controller 905 indicative of this temperature. The controller 905 may then use this temperature information to direct system 925 to cool the cooling chuck 570 to the target temperature.

Controller 905 also communicates with one or more safety shutdown elements 930. The safety shutdown elements 930 are activated by the controller 905 when the controller detects one or more conditions that compromise the safety of the thermal reactor. For example, the safety shutdown elements 930 may be used by the controller 905 to shutdown the thermal reactor system in response to an over temperature condition of the heating chuck, reactor chamber, etc. It will be recognized in view of these teachings that other safety conditions may also be detected by the controller 905 pursuant to activation of the safety shutdown elements 930.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention.

What is claimed is:

1. An apparatus for thermally processing a microelectronic workpiece, comprising:
   first and second members positionable relative to one another to form a thermal process chamber;
   a thermal transfer unit in thermal communication with the thermal process chamber at least when the first and second members are juxtaposed proximate to one another;
   an actuator coupled to at least one of the first and second members to juxtapose the members proximate one another to form the thermal process chamber while the thermal transfer unit has an at least generally fixed position; and
   a workpiece support so constructed and arranged that a microelectronic workpiece carried by the support will be transferred to a position at least closer to the thermal process unit as a consequence of the actuator juxtaposing the members proximate one another.

2. The apparatus of claim 1 wherein the first member is movable relative to the second member, and wherein the thermal transfer unit has a fixed position relative to the second member.

3. The apparatus of claim 1 wherein the thermal transfer unit has a contact surface positioned to releasably contact the microelectronic workpiece, and wherein the workpiece support is positioned to release the microelectronic workpiece into contact with the contact surface when the members are juxtaposed proximate to one another.

4. The apparatus of claim 1 wherein the first member is positioned above the second member.

5. The apparatus of claim 1 wherein the thermal transfer unit includes a heater.

6. The apparatus of claim 1 wherein the thermal transfer unit includes an electrical resistance heater and a ceramic substrate.

7. The apparatus of claim 1 wherein the thermal transfer unit is a first thermal transfer unit positioned to heat the microelectronic workpiece and wherein the apparatus further comprises a second thermal transfer unit positioned to cool the first thermal transfer unit, at least one of the first and second thermal transfer units being movable relative to the other between a first position with the first thermal transfer unit generally out of thermal communication with the second thermal transfer unit and a second position with the first thermal transfer unit in thermal communication with the second thermal transfer unit.

8. The apparatus of claim 1 wherein the thermal transfer unit is a first thermal transfer unit positioned to heat the microelectronic workpiece and wherein the apparatus further comprises a second thermal transfer unit positioned to cool the first thermal transfer unit, at least one of the first and second thermal transfer units being movable relative to the other between a first position with the first thermal transfer unit spaced apart from the second thermal transfer unit and a second position with the first thermal transfer unit in contact with the second thermal transfer unit.

9. The apparatus of claim 1 wherein the workpiece support is movable relative to the thermal transfer unit between a first position with the microelectronic workpiece generally out of thermal communication with the thermal transfer unit, and a second position with the microelectronic workpiece in thermal communication with the thermal transfer unit.

10. The apparatus of claim 1 wherein the thermal transfer unit includes vacuum passages coupleable to a vacuum source, the vacuum passages being positioned to apply a vacuum to the microelectronic workpiece when the members are juxtaposed proximate to one another.

11. An apparatus for processing a microelectronic workpiece, comprising:
    first and second assemblies positionable relative to one another to form a thermal process chamber therebetween, the second assembly including a thermal transfer unit having an at least generally fixed position and so constructed and arranged to be in thermal communication with the thermal process chamber when the first and second assemblies are juxtaposed proximate to one another;
    an actuator coupled to at least one of the first and second assemblies to juxtapose the assemblies proximate one another to form the thermal process chamber; and
    a workpiece support connected to one of the first and second assemblies, the support being so constructed and arranged that a microelectronic workpiece carried by the support will be transferred from the support to the thermal process unit as a consequence of the actuator juxtaposing the assemblies proximate one another.

12. The apparatus of claim 11, further comprising:
    a loading station positioned to receive microelectronic workpieces;
    an automated workpiece transfer device positioned at least proximate to the loading station and the first and second assemblies, the workpiece transfer device being movable relative to both the loading station and the assemblies to move microelectronic workpieces between the loading station and the assemblies; and an enclosure disposed around at least a portion of the assemblies, the loading station and the workpiece transfer device.

13. The apparatus of claim 11, further comprising a processing station configured to apply a material to a microelectronic workpiece.

14. The apparatus of claim 1 wherein the first member is positioned above the second member and wherein relative movement of at least one member disengages the microelectronic workpiece from the workpiece support and positions the microelectronic workpiece in contact with the thermal transfer unit.

15. The apparatus of claim 1 wherein the thermal transfer unit includes a cooler.

16. The apparatus of claim 11 wherein the first assembly is positioned above the second assembly and wherein relative movement of the at least one assembly disengages the microelectronic workpiece from the workpiece support and positions the microelectronic workpiece in contact with the thermal transfer unit.

17. The apparatus of claim 11 wherein the thermal transfer unit includes a heater.

18. The apparatus of claim 11 wherein the thermal transfer unit includes a cooler.

19. The apparatus of claim 11 wherein the first assembly is movable relative to the second assembly, and wherein the thermal transfer unit has a fixed position relative to the second assembly.

20. The apparatus of claim 1 wherein the at least one member contacts the workpiece support as it moves to juxtapose the members proximate to one another.

21. The apparatus of claim 1 wherein the workpiece support is positioned to limit motion of the at least one member as the at least one member moves to juxtapose the members proximate to one another.

22. The apparatus of claim 1 wherein the thermal transfer unit includes at least one recess positioned to receive a corresponding portion of the workpiece support when the members are juxtaposed proximate to each other.

23. The apparatus of claim 1 wherein at least one of the first and second members includes a port coupleable to a source of gas to introduce gas into the thermal process chamber when the members are juxtaposed proximate to each other.

24. The apparatus of claim 11 wherein the at least one assembly contacts the workpiece support as it moves to juxtapose the assemblies proximate to one another.

25. The apparatus of claim 11 wherein the workpiece support is positioned to limit motion of the at least one assembly as the at least one assembly moves to juxtapose the assemblies proximate to one another.

26. The apparatus of claim 11 wherein the thermal transfer unit includes at least one recess positioned to receive a corresponding portion of the workpiece support when the assemblies are juxtaposed proximate to each other.

27. The apparatus of claim 11 wherein at least one of the first and second assemblies includes a port coupleable to a source of gas to introduce gas into the thermal process chamber when the assemblies are disposed proximate to each other.

28. The apparatus of claim 11 wherein the thermal transfer unit includes vacuum passages coupleable to a vacuum source, the vacuum passages being positioned to apply a vacuum to the microelectronic workpiece when the assemblies are juxtaposed proximate to on another.

29. An apparatus for thermally processing a microelectronic workpiece, comprising:
first and second members positionable relative to one another to form a thermal process chamber, the first member being positioned above the second member;
a thermal transfer unit in thermal communication with the thermal process chamber at least when the first and second members are juxtaposed proximate to one another;
an actuator coupled to at least one of the first and second members to juxtapose the members proximate one another to form the thermal process chamber; and
a workpiece support carried by the first member and so constructed and arranged that a microelectronic workpiece carried by the support will be transferred to a position at least closer to the thermal process unit as a consequence of the actuator juxtaposing the members proximate one another.

30. The apparatus of claim 29 wherein the thermal transfer unit has a contact surface positioned to releasably contact the microelectronic workpiece, and wherein the workpiece support is positioned to release the microelectronic workpiece into contact with the contact surface when the members are juxtaposed proximate to one another.

31. The apparatus of claim 29 wherein the thermal transfer unit includes a heater.

32. The apparatus of claim 29 wherein the thermal transfer unit is a first thermal transfer unit positioned to heat the microelectronic workpiece and wherein the apparatus further comprises a second thermal transfer unit positioned to cool the first thermal transfer unit, at least one of the first and second thermal transfer units being movable relative to the other between a first position with the first thermal transfer unit generally out of thermal communication with the second thermal transfer unit and a second position with the first thermal transfer unit in thermal communication with the second thermal transfer unit.

33. The apparatus of claim 29 wherein the workpiece support is movable relative to the thermal transfer unit between a first position with the microelectronic workpiece generally out of thermal communication with the thermal transfer unit, and a second position with the microelectronic workpiece in thermal communication with the thermal transfer unit.

34. An apparatus for processing a microelectronic workpiece, comprising:
first and second assemblies positionable relative to one another to form a thermal process chamber therebetween, the second assembly positioned below the first assembly and including a thermal transfer unit so constructed and arranged to be in thermal communication with the thermal process chamber when the first and second assemblies are juxtaposed proximate to one another;
an actuator coupled to at least one of the first and second assemblies to juxtapose the assemblies proximate one another to form the thermal process chamber; and
a workpiece support carried by the first assembly, the support being so constructed and arranged that a microelectronic workpiece carried by the support will be transferred from the support to the thermal process unit as a consequence of the actuator juxtaposing the assemblies proximate one another.

35. The apparatus of claim 34 further comprising a processing station configured to apply a material to a microelectronic workpiece.

36. The apparatus of claim 34 wherein the thermal transfer unit includes a heater.

37. The apparatus of claim 34 wherein the thermal transfer unit includes a cooler.

38. The apparatus of claim 34 wherein the workpiece support is positioned to limit motion of the at least one assembly as the at least one assembly moves to juxtapose the assemblies proximate to one another.

39. An apparatus for processing a microelectronic workpiece, comprising:

a first assembly that includes a movable first member and a workpiece support configured to carry a microelectronic workpiece;

a second assembly that includes a thermal transfer unit and is positioned below the first member, the first member being positionable relative to thermal transfer unit to form a thermal process chamber between the first member and the thermal process unit when the first and second assemblies are juxtaposed proximate to one another; and an actuator coupled to the first assembly to juxtapose the assemblies proximate one another to form the thermal process chamber.

40. The apparatus of claim 39 wherein the second assembly includes a second member below the first member, and wherein the thermal transfer unit has an at least generally fixed position relative to the second member, further wherein the first member and the workpiece support are movable relative to the second member and the thermal transfer unit.

41. The apparatus of claim 39 wherein the workpiece support is so constructed and arranged that a microelectronic workpiece carried by the support will be transferred from the support to the thermal process unit as a consequence of the actuator juxtaposing the assemblies proximate one another.

42. The apparatus of claim 39 wherein the thermal transfer unit is a first thermal transfer unit, and wherein the second assembly includes a second thermal transfer unit, with at least one of the thermal transfer units movable relative to the other.

43. An apparatus for thermally processing a microelectronic workpiece, comprising:

first and second members positionable relative to one another to form a thermal process chamber;

a thermal transfer unit in thermal communication with the thermal process chamber at least when the first and second members are juxtaposed proximate to one another;

an actuator coupled to at least one of the first and second members to juxtapose the members proximate one another to form the thermal process chamber while the thermal transfer unit has an at least generally fixed position; and a workpiece support configured to carry a microelectronic workpiece in the thermal process chamber.

44. The apparatus of claim 43 wherein the workpiece support is so constructed and arranged that a microelectronic workpiece carried by the support will be transferred to a position at least closer to the thermal process unit as a consequence of the actuator juxtaposing the members proximate one another.

45. An apparatus for thermally processing a microelectronic workpiece, comprising:

first and second members positionable relative to one another to form a thermal process chamber, the first member being positioned above the second member;

a thermal transfer unit in thermal communication with the thermal process chamber at least when the first and second members are juxtaposed proximate to one another;

an actuator coupled to at least one of the first and second members to juxtapose the members proximate one another to form the thermal process chamber; and a workpiece support carried by the first member and configured to carry a microelectronic workpiece.

46. The apparatus of claim 45 wherein the workpiece support is so constructed and arranged that a microelectronic workpiece carried by the support will be transferred to a position at least closer to the thermal process unit as a consequence of the actuator juxtaposing the members proximate one another.

* * * * *